(12) United States Patent
Austin et al.

(10) Patent No.: US 6,961,403 B1
(45) Date of Patent: Nov. 1, 2005

(54) PROGRAMMABLE FREQUENCY DIVIDER WITH SYMMETRICAL OUTPUT

(75) Inventors: John S. Austin, Winooski, VT (US); Matthew T. Sobel, Grand Haven, MI (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/709,804

(22) Filed: May 28, 2004

(51) Int. Cl.[7] ............................................. G11C 19/00
(52) U.S. Cl. ........................... 377/80; 377/47; 377/48; 327/115; 327/117; 708/252
(58) Field of Search .............................. 377/80, 47, 48; 327/115, 117; 708/252

(56) References Cited

U.S. PATENT DOCUMENTS

| | | | |
|---|---|---|---|
| 5,065,415 A | 11/1991 | Yamashita | 377/52 |
| 5,349,622 A | 9/1994 | Gorisse | 377/52 |
| 5,948,046 A | 9/1999 | Hagberg | 708/103 |
| 6,057,719 A | 5/2000 | Austin et al. | 327/117 |
| 6,459,310 B1 * | 10/2002 | Thomson et al. | 327/115 |
| 6,700,446 B2 | 3/2004 | Ke | 327/156 |

* cited by examiner

Primary Examiner—Margaret R. Wambach
(74) Attorney, Agent, or Firm—Michael J. LeStrange

(57) ABSTRACT

A programmable frequency divider circuit with symmetrical output is disclosed. The frequency divider includes a non-symmetrical LFSR based component operated in series with a symmetrical divider component. Both the LFSR and the symmetrical divider may be programmed to provide flexibility. The frequency divider can dynamically adjust the divisor of the LFSR component to overcome limitations in the divide resolution due to the series combination of dividers, providing even and odd divisor values. The divider architecture can also provide higher level functions, including synchronization of multiple divider outputs, dynamic switching of divisor values and generation of multi-phased and spaced outputs. The linear feedback shift register (LFSR) component includes a feedback logic network decomposed into multiple stages to realize a maximum latch-to-latch operational latency of one gate delay regardless of the size of the LFSR.

25 Claims, 34 Drawing Sheets

100

| State | L0 | L1 | L2 | L3 | State | L0 | L1 | L2 | L3 |
|-------|----|----|----|----|-------|----|----|----|----|
| 1 | 0 | 0 | 0 | 0 | 9 | 0 | 0 | 0 | 1 |
| 2 | 1 | 0 | 0 | 0 | 10 | 1 | 0 | 0 | 1 |
| 3 | 0 | 1 | 0 | 0 | 11 | 0 | 1 | 0 | 1 |
| 4 | 1 | 1 | 0 | 0 | 12 | 1 | 1 | 0 | 1 |
| 5 | 0 | 0 | 1 | 0 | 13 | 0 | 0 | 1 | 1 |
| 6 | 1 | 0 | 1 | 0 | 14 | 1 | 0 | 1 | 1 |
| 7 | 0 | 1 | 1 | 0 | 15 | 0 | 1 | 1 | 1 |
| 8 | 1 | 1 | 1 | 0 | 16 | 1 | 1 | 1 | 1 |

PRIOR ART

FIG. 1

PRIOR ART

103

| State | L0 | L1 | L2 | L3 | State | L0 | L1 | L2 | L3 |
|-------|----|----|----|----|-------|----|----|----|----|
| 1a | 0 | 0 | 0 | 0 | 1b | 0 | 0 | 1 | 0 |
| 2a | 1 | 0 | 0 | 0 | 2b | 1 | 0 | 0 | 1 |
| 3a | 1 | 1 | 0 | 0 | 3b | 0 | 1 | 0 | 0 |
| 4a | 1 | 1 | 1 | 0 | 4b | 1 | 0 | 1 | 0 |
| 5a | 1 | 1 | 1 | 1 | 5b | 1 | 1 | 0 | 1 |
| 6a | 0 | 1 | 1 | 1 | 6b | 0 | 1 | 1 | 0 |
| 7a | 0 | 0 | 1 | 1 | 7b | 1 | 0 | 1 | 1 |
| 8a | 0 | 0 | 0 | 1 | 8b | 0 | 1 | 0 | 1 |

FIG. 4

PRIOR ART

106

| State | L0 | L1 | L2 | L3 | State | L0 | L1 | L2 | L3 |
|-------|----|----|----|----|-------|----|----|----|----|
| 1 | 0 | 0 | 0 | 1 | 9 | 0 | 1 | 0 | 1 |
| 2 | 1 | 0 | 0 | 0 | 10 | 1 | 0 | 1 | 0 |
| 3 | 0 | 1 | 0 | 0 | 11 | 1 | 1 | 0 | 1 |
| 4 | 0 | 0 | 1 | 0 | 12 | 1 | 1 | 1 | 0 |
| 5 | 1 | 0 | 0 | 1 | 13 | 1 | 1 | 1 | 1 |
| 6 | 1 | 1 | 0 | 0 | 14 | 0 | 1 | 1 | 1 |
| 7 | 0 | 1 | 1 | 0 | 15 | 0 | 0 | 1 | 1 |
| 8 | 1 | 0 | 1 | 1 | | | | | |

FIG. 6

| LFSR Divide Value | DIV0 | DIV1 | DIV2 | DIV3 | LFSR Divide Value | DIV0 | DIV1 | DIV2 | DIV3 |
|---|---|---|---|---|---|---|---|---|---|
| 1 | 0 | 0 | 0 | 0 | 9 | 1 | 1 | 0 | 0 |
| 2 | 1 | 1 | 1 | 1 | 10 | 1 | 0 | 0 | 1 |
| 3 | 1 | 1 | 1 | 0 | 11 | 0 | 0 | 1 | 0 |
| 4 | 1 | 1 | 0 | 1 | 12 | 0 | 1 | 0 | 0 |
| 5 | 1 | 0 | 1 | 0 | 13 | 1 | 0 | 0 | 0 |
| 6 | 0 | 1 | 0 | 1 | 14 | 0 | 0 | 0 | 1 |
| 7 | 1 | 0 | 1 | 1 | 15 | 0 | 0 | 1 | 1 |
| 8 | 0 | 1 | 1 | 0 | 16 | 0 | 1 | 1 | 1 |

| Final Divide Value | DIV0 | DIV1 | DIV2 | DIV3 | Final Divide Value | DIV0 | DIV1 | DIV2 | DIV3 |
|---|---|---|---|---|---|---|---|---|---|
| 2  | 0 | 0 | 0 | 0 | 18 | 1 | 1 | 0 | 0 |
| 4  | 1 | 1 | 1 | 1 | 20 | 1 | 0 | 0 | 1 |
| 6  | 1 | 1 | 1 | 0 | 22 | 0 | 0 | 1 | 0 |
| 8  | 1 | 1 | 0 | 1 | 24 | 0 | 1 | 0 | 0 |
| 10 | 1 | 0 | 1 | 0 | 26 | 1 | 0 | 0 | 0 |
| 12 | 0 | 1 | 0 | 1 | 28 | 0 | 0 | 0 | 1 |
| 14 | 1 | 0 | 1 | 1 | 30 | 0 | 0 | 1 | 1 |
| 16 | 0 | 1 | 1 | 0 | 32 | 0 | 1 | 1 | 1 |

| LFSR Divide Value | Final Divide Value | DIV0 'a' | LOW\|HIGH=1 DIV1 'a' | DIV2 'a' | DIV3 'a' | LOW\|HIGH=0 DIV0 'b' | DIV1 'b' | DIV2 'b' | DIV3 'b' |
|---|---|---|---|---|---|---|---|---|---|
| 1 | 2 | 0 | 0 | 0 | 0 | 0 | 0 | 0 | 0 |
| 2,1 | 3 | 1 | 1 | 1 | 1 | 0 | 0 | 0 | 0 |
| 2 | 4 | 1 | 1 | 1 | 1 | 1 | 1 | 1 | 1 |
| 3,2 | 5 | 1 | 1 | 1 | 0 | 1 | 1 | 1 | 1 |
| 3 | 6 | 1 | 1 | 1 | 0 | 1 | 1 | 1 | 0 |
| 4,3 | 7 | 1 | 1 | 0 | 1 | 1 | 1 | 1 | 0 |
| 4 | 8 | 1 | 1 | 0 | 1 | 1 | 1 | 0 | 1 |
| 5,4 | 9 | 1 | 0 | 1 | 0 | 1 | 1 | 0 | 1 |
| 5 | 10 | 1 | 0 | 1 | 0 | 1 | 0 | 1 | 0 |

FIG. 12

| Final Divide Value | DIV0 | DIV1 | DIV2 | DIV3 | DIV4 | Final Divide Value | DIV0 | DIV1 | DIV2 | DIV3 | DIV4 |
|---|---|---|---|---|---|---|---|---|---|---|---|
| 1 | 0 | 0 | 0 | 0 | 1 | 17 | 1 | 1 | 0 | 0 | 1 |
| 2 | 0 | 0 | 0 | 0 | 0 | 18 | 1 | 1 | 0 | 0 | 0 |
| 3 | 1 | 1 | 1 | 1 | 1 | 19 | 1 | 0 | 0 | 1 | 1 |
| 4 | 1 | 1 | 1 | 1 | 0 | 20 | 1 | 0 | 0 | 1 | 0 |
| 5 | 1 | 1 | 1 | 0 | 1 | 21 | 0 | 0 | 1 | 0 | 1 |
| 6 | 1 | 1 | 1 | 0 | 0 | 22 | 0 | 0 | 1 | 0 | 0 |
| 7 | 1 | 1 | 0 | 1 | 1 | 23 | 0 | 1 | 0 | 0 | 1 |
| 8 | 1 | 1 | 0 | 1 | 0 | 24 | 0 | 1 | 0 | 0 | 0 |
| 9 | 1 | 0 | 1 | 0 | 1 | 25 | 1 | 0 | 0 | 0 | 1 |
| 10 | 1 | 0 | 1 | 0 | 0 | 26 | 1 | 0 | 0 | 0 | 0 |
| 11 | 0 | 1 | 0 | 1 | 1 | 27 | 0 | 0 | 0 | 1 | 1 |
| 12 | 0 | 1 | 0 | 1 | 0 | 28 | 0 | 0 | 0 | 1 | 0 |
| 13 | 1 | 0 | 1 | 1 | 1 | 29 | 0 | 0 | 1 | 1 | 1 |
| 14 | 1 | 0 | 1 | 1 | 0 | 30 | 0 | 0 | 1 | 1 | 0 |
| 15 | 0 | 1 | 1 | 0 | 1 | 31 | 0 | 1 | 1 | 1 | 1 |
| 16 | 0 | 1 | 1 | 0 | 0 | 32 | 0 | 1 | 1 | 1 | 0 |

FIG. 15

| L0 | L1 | L2 | L3 | L4 | L5 | L6 | L7 | State | Out |
|----|----|----|----|----|----|----|----|-------|-----|
| 0 | 0 | 0 | 0 | 1 | 0 | 1 | 0 | 63 | 0 |
| 0 | 0 | 0 | 0 | 0 | 1 | 0 | 1 | 64 | 0 |
| 1 | 0 | 0 | 0 | 0 | 0 | 1 | 0 | 65 | 0 |
| | | | | | | | | 66 ---> 254 | 0 |
| 1 | 1 | 1 | 1 | 1 | 1 | 1 | 1 | 255 ($2^N-1$) | 1 |
| 0 | 1 | 1 | 1 | 1 | 1 | 1 | 1 | 1 | 0 |

| L0 | L1 | L2 | L3 | L4 | L5 | L6 | L7 | L0B | State | Out |
|----|----|----|----|----|----|----|----|-----|-------|-----|
| 0  | 0  | 0  | 0  | 1  | 0  | 1  | 0  | 0   | 63    | 0   |
| 1  | 0  | 0  | 0  | 0  | 1  | 0  | 1  | 1   | 64    | 0   |
| 1  | 0  | 0  | 0  | 0  | 0  | 1  | 0  | 0   | 65    | 0   |

| L0 | L1 | L2 | State | Out |
|---|---|---|---|---|
| 0 | 0 | 1 | 1 | 0 |
| 1 | 1 | 0 | 2 | 0 |
| 0 | 1 | 1 | 3 | 0 |
| 1 | 0 | 1 | 4 | 0 |
| 0 | 1 | 0 | 5 | 0 |
| 1 | 1 | 1 | 6 ($2^N-2$) | 1 |
| 0 | 0 | 1 | 1 | 0 |
| 1 | 1 | 0 | 2 | 0 |
| 0 | 1 | 1 | 3 | 0 |

| L0 | L1 | L2 | State | Out |
|----|----|----|-------|-----|
| 0  | 0  | 0  | 1     | 0   |
| 1  | 0  | 1  | 2     | 0   |
| 0  | 1  | 0  | 3     | 0   |
| 1  | 1  | 1  | 4 [2(N-1)] | 1 |
| 0  | 0  | 0  | 1     | 0   |
| 1  | 0  | 1  | 2     | 0   |
| 0  | 1  | 0  | 3     | 0   |

| L0 | L1 | L2 | L3 | L0B | State | Out |
|----|----|----|----|-----|-------|-----|
| 0 | 1 | 1 | 1 | 0 | 1 | 0 |
| 0 | 0 | 1 | 1 | 0 | 2 | 0 |
| 0 | 0 | 0 | 1 | 0 | 3 | 0 |
| 1 | 0 | 0 | 0 | 0 | 4 | 0 |
| 1 | 1 | 0 | 0 | 1 | 5 | 0 |
| 1 | 0 | 1 | 0 | 1 | 6 | 0 |
| 1 | 0 | 0 | 1 | 0 | 7 | 0 |
| 1 | 1 | 0 | 0 | 0 | 8 | 0 |
| 1 | 1 | 1 | 0 | 1 | 9 | 0 |
| 1 | 0 | 1 | 1 | 0 | 10 | 0 |
| 0 | 1 | 0 | 1 | 0 | 11 | 0 |
| 1 | 0 | 1 | 0 | 0 | 12 | 0 |
| 1 | 1 | 0 | 1 | 0 | 13 | 0 |
| 1 | 1 | 1 | 0 | 0 | 14 | 0 |
| 1 | 1 | 1 | 1 | 0 | 15($2^N-1$) | 1 |
| 0 | 1 | 1 | 1 | 0 | 1 | 0 |
| 0 | 0 | 1 | 1 | 0 | 2... | 0 |

PROGRAMMABLE FREQUENCY DIVIDER WITH SYMMETRICAL OUTPUT

BACKGROUND OF INVENTION

1. Field of the Invention

The present invention relates to the field of integrated circuit frequency dividers, particularly the realization of a symmetrical and fully programmable frequency divider using a high speed linear feedback shift register (LFSR).

2. Background of the Invention

In its most basic implementation, a divider circuit will accept an input signal with a given frequency and provide an output signal with a lower frequency. The relationship between the output and input signal frequencies is of the form of a programmable ratio, that is, the frequency of the output signal will be the frequency of the input signal divided by a factor N. This factor, known as the 'divide value' of the divider circuit, is programmable via input 'control' signals to the divider. These control signals are digital in nature, can assume values of '1' or '0', and the number of control signals will determine the number of 'divide modes' of the divider, that is, the number of possible values for N. The other key characteristics of divider circuits are the 'divide range' and 'divide resolution'. The 'divide range' is the maximum and minimum value of N, and the 'divide resolution' is the granularity of N, that is, the difference between consecutive N values. For example a divider with two control bits can generally have $2^2=4$ divide modes. If the divide modes have N values of 2, 4, 6, 8, then the divide range is 2 through 8, and the divide resolution is 2.

The performance requirements of divider circuits have increasingly demanded a greater number of divide modes, a wider divide range, and the smallest possible divide resolution. There are currently many divider styles in use that address each of these requirements individually. The real challenge, however, is to meet all of these requirements along with the additional demands that a divider circuit be able to process higher signal frequencies, occupy less physical area and consume less power.

The LFSR is increasingly utilized as a primary element in frequency divider circuits. Essentially a counter, the LFSR can operate at much higher frequencies than traditional counter designs due its simplicity of design. The LFSR typically consumes less power and area than conventional counter designs as well.

The core element of a conventional frequency divider circuit is a counter. A counter is a circuit generally composed of multiple storage elements, such as latches. The value of the storage elements, or latches, at any given time defines the 'state' of the counter. The counter is designed such that it will change its state in response to a triggering event. With latches, this event is usually a rising or falling clock transition. The total number of unique states the counter will occupy while being clocked determines the maximum count it can achieve. Once the counter has reaches its maximum count, it may stop counting and await a 'refresh' signal, or it may repeat the counting cycle. Most counters perform the latter and will continuously cycle through a set of unique states. This sequence is periodic in nature and is the basis for frequency division. In a frequency divider circuit, an output signal is generated such that it will complete one cycle for each iteration of the counter through the set of unique states. If the number of unique states is N, then the divisor value of the divider is N and the frequency of the output signal is equivalent to the frequency of the counter input clock signal divided by N.

Key features of most counters includes not only the number of unique states but also the manner in which the counter cycles through each state. The state of a counter can be represented as a binary number, where each latch represents a single 'bit'. As clock transitions occur, the state of the counter usually changes such that the binary number corresponding to a particular state either increases or decreases in a sequential manner. FIG. 1 shows a state transition table 100 for a four latch counter, wherein the columns L0–L3 represent the latches, or bits that define the state. In FIG. 2, the logic schematic of the four latch binary sequential counter frequency divider 101 is shown. The most significant bit (MSB) of the counter serves as the output OUT, which will complete one cycle for each iteration of the counter through the set of unique states. A major disadvantage of the sequential counter approach is that it requires progressively more complex logic between each stage as the counter grows in size, which will cause the performance of the divider to degrade.

A class of dividers designed to overcome the limitations of the sequential counter divider circuit is the binary shift register based frequency divider 102 shown in FIG. 3. In this design, the output of the shift-register is inverted and fed back to the input, providing greater economy with respect to the logic required between stages. However, the shift-register divider will transition through only one of two unique state domains as depicted in the dual state transition table 103 of FIG. 4. Consequently, only one half of the total number of available states of the divider are useable. In addition, the shift-register divider requires initialization of the latches to prevent spurious state transitions between the two domains of the state transition table. Thus, while the shift-register divider addresses the performance issues of the counter based designs, it does so at the expense of the maximum divisor value.

FIG. 5 illustrates a linear feedback shift register (LFSR) 104 implementation of a frequency divider. This type of design allows the divider to cycle through all but one of its unique states, while enjoying low circuit overhead in the data path. One drawback, however, is that the states do not transition in a predictable order which prevents the output from being taken directly from one of the latches. Instead, an additional logic gate, such as the AND gate 105 shown in FIG. 5 is needed to detect the occurrence of one of the states. The additional circuitry slightly limits the performance of the divider because of the added loading but ensures transition through all of the unique states. While the amount of logic placed within the datapath of the divider is minimal for the LFSR, this design will not produce an output with a fifty percent duty cycle. The output of the LFSR divider has a pulse width equal to one period of the input clock. The state transition table 106 for the LFSR divider is shown in FIG. 6.

FIG. 8 shows a prior art programmable LFSR disclosed in U.S. Pat. No. 6,057,719 issued to Austin, et al., which is incorporated herein by reference.

SUMMARY OF INVENTION

The present invention is directed toward a programmable frequency divider circuit capable of maintaining an output with a fifty-percent duty cycle. The frequency divider includes a non-symmetrical LFSR based component operated in series with a symmetrical divider component. The LFSR component of the present invention provides the means to achieve very high divisor values for the circuit, while the symmetrical divider component converts the asymmetrical output of the LFSR divider into a symmetrical output with a fifty-percent duty cycle. Both the LFSR divider and the symmetrical divider may be programmed to provide flexibility of divide operation via input control bits.

The present invention also employs a technique to dynamically adjust the divisor of the LFSR based divider component to overcome inherent limitations in the divide resolution due to the series combination of dividers. The divide resolution can be restored to a value as low as one allowing the disclosed divider to provide both even and odd divisor values.

By relegating the bulk of the division process to the LFSR based component, the frequency divider of the present invention can operate at high speed. In addition, the design requires fewer logic elements in the data path compared with prior art designs, thereby consuming less physical area and dissipating less power. The design architecture also lends itself to the performance of higher level functions, such as the synchronization of multiple divider outputs, dynamic switching of divisor values and the generation of multi-phase and spaced outputs.

The LFSR implemented in the programmable frequency divider circuit employs a number of techniques to improve the delay of the LFSR feedback network which enhances the efficiency of the frequency divide operation. First, the feedback network is reduced by distributing the XOR functions of the feedback network across several latches, which effectively extends the function of the feedback network over multiple clock cycles. Similarly, the LFSR treats a single XOR element as a multi-stage logic function by distributing the function across more than one latch thereby extending the XOR operation over more than one clock cycle. Lastly, the odd numbered $2^n-1$ count of the LFSR, where n is an odd number of latches, is operated in parallel with a counter producing an even numbered ($2^m$) output, where m is an even number of latches The respective states of the two devices are combined to form a hybrid $2^m*(2^n-1)$ counter. This approach allows a slower high-count LFSR to be replaced with a faster lower-count LFSR in parallel with a fast even numbered output counter.

BRIEF DESCRIPTION OF DRAWINGS

FIG. 1 shows a table indicating the sequence of states for a counter composed of four latches. The columns L0–L3 represent the latches, or 'bits', that define the state.

FIG. 4. depicts a split domain state transition table for the shift-register based divider circuit of FIG. 3.

FIG. 6 shows the state transition table for the LFSR based divider circuit.

FIG. 9 depicts the state transition table for the LFSR frequency divider of FIG. 8.

FIG. 10 shows the state transition table for the combination asymmetrical LFSR divide component and the symmetrical divide-by-2 component of FIG. 7.

FIG. 12 shows the state transition table for the frequency divider of FIG. 11.

FIG. 15 shows the final divide values and corresponding values of the divide mode control bits.

FIG. 25 depicts the state transition table for LFSR of FIGS. 23 and 24.

FIG. 26 shows a partial state transition table for the LFSR of FIG. 25.

FIG. 28 shows a state transition table for the divide-by-two counter of FIG. 27.

FIG. 29 illustrates a state transition table for a hypothetical even numbered LFSR and a divide-by-two counter.

FIG. 32 illustrates a state transition table corresponding to the LFSR of FIG. 31.

DETAILED DESCRIPTION

The Programmable Frequency Divider

Figure 7:
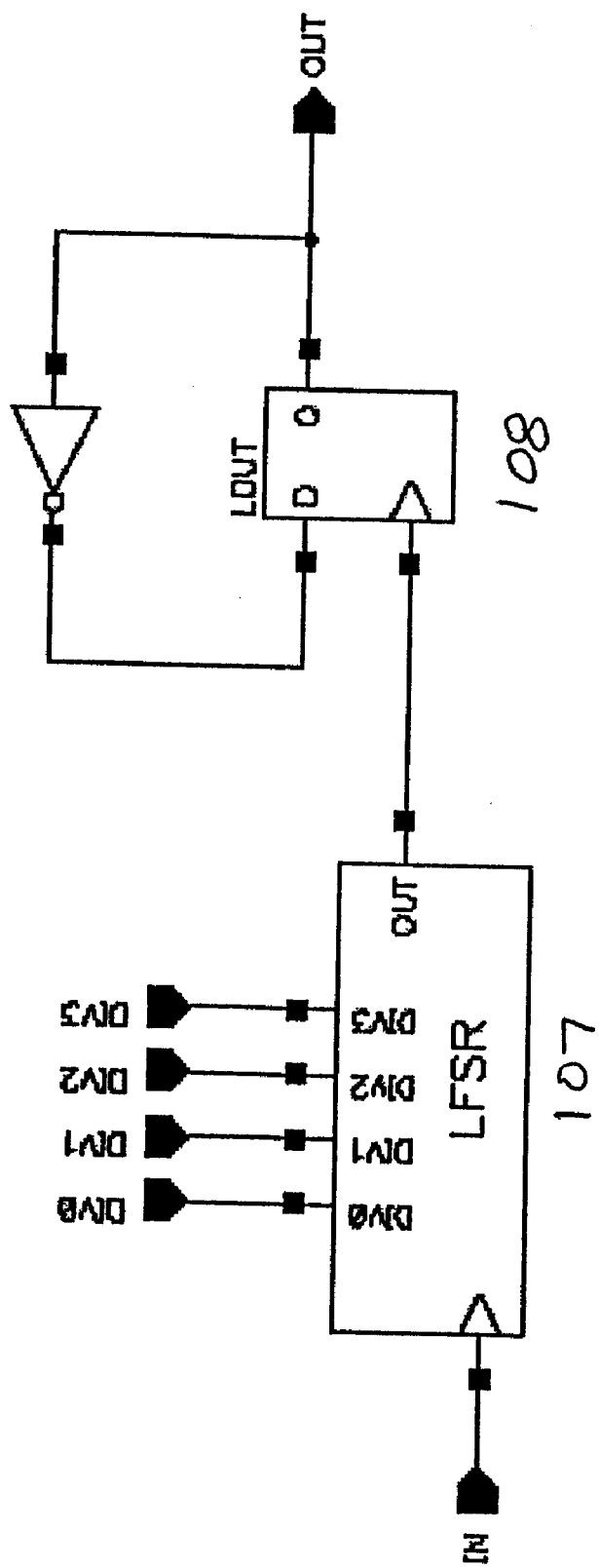
FIG. 7 illustrates a LFSR based divider component cascaded in series with a symmetric divide-by-2 circuit.
Figure 8:
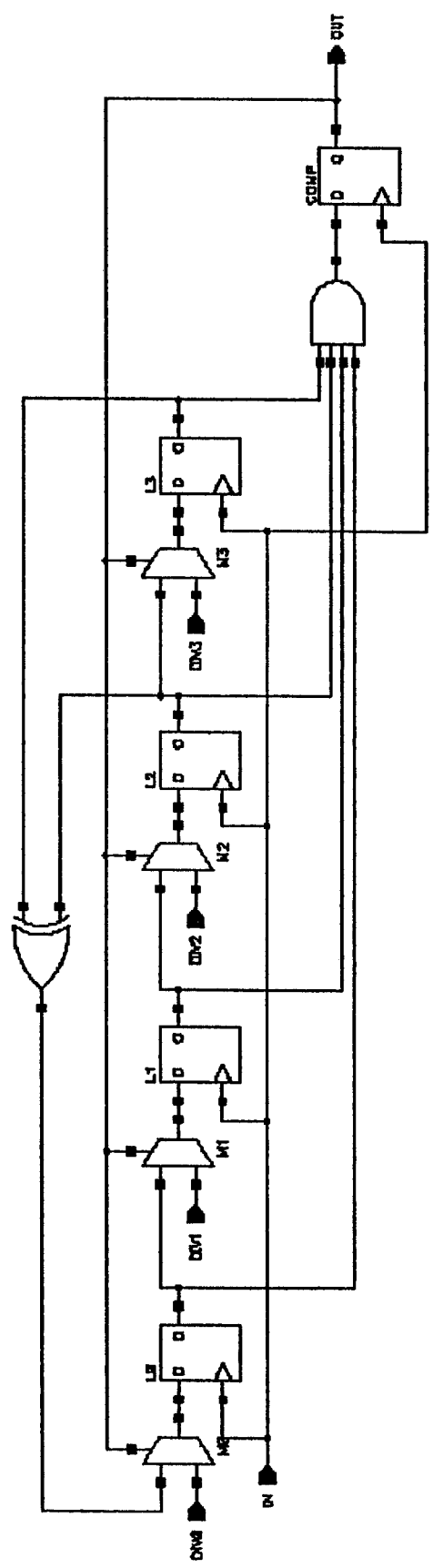
FIG. 8 shows a prior art programmable LFSR frequency divider.

The block diagram of FIG. 7 shows an asymmetrical LFSR based divider circuit 107 cascaded in series with a symmetrical divide-by-two circuit 108. Although the range of divisor values is doubled in this implementation, as compared to the single LFSR divider 104 shown in FIG. 5, the resolution is halved. In addition, the capability to perform division with an odd number divisor value, i.e. 3, 5, 7, etc. is sacrificed. The final divide state transition table for the cascaded asymmetrical and symmetrical divider 110 is shown in FIG. 10. Accordingly, a need exists to provide a divider circuit capable of performing frequency division with high value divisors without losing odd numbered divisors in the process.

Figure 11:
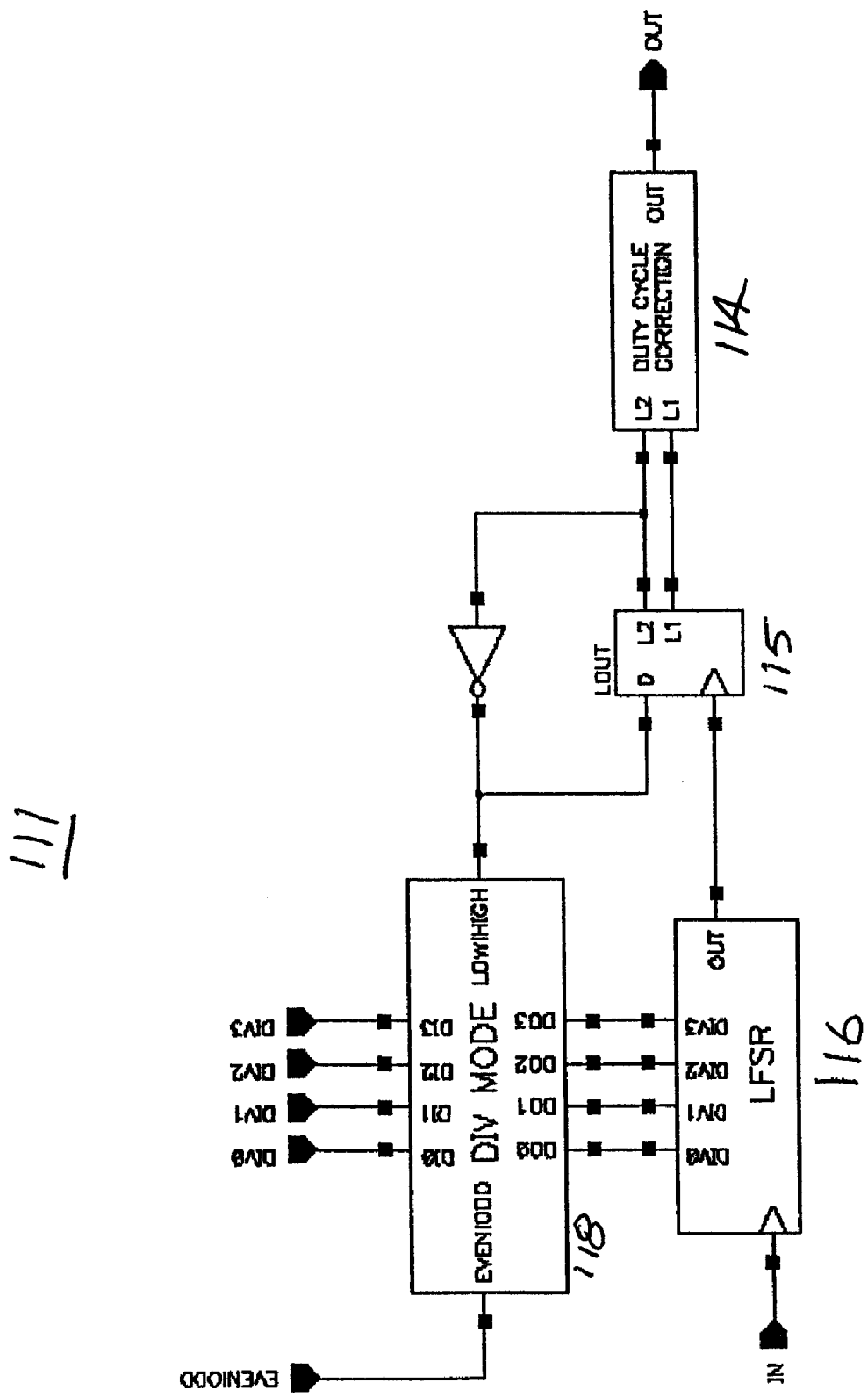
FIG. 11 illustrates a circuit block diagram of the LFSR divider component, symmetrical divider component, duty cycle correction unit and divide mode controller.

FIG. 11 shows a block diagram of a programmable high speed frequency divider circuit 111, according to one aspect of the present invention, that is capable of restoring the odd numbered divisors in a LFSR based divider. The odd numbered divide values are realized by alternating the divide value of the LFSR 116 between a desired divisor value +1 and a desired divisor value −1. The divide value is alternated with the polarity of the latch LOUT 115 output. For example to achieve a final divide value of 4, the LFSR 116 would provide a divide value of 2. This divide value multiplied by the symmetrical divide-by-two circuit 115 results in a final divide value of 4. To realize a divide-by-five function, however, the divide value of the LFSR must alternate between 3 and 2. That is, the LFSR will output one pulse for three input clock cycles, then one pulse for two input clock cycles. In this configuration, the output of the symmetrical divide-by-two circuit is 2.5 and the final divide value is 2.5×2=5.

FIG. 12 lists a table of values 117 for the DIV[0:3] inputs to the LFSR for divide values 1 through 10. The bits labeled DIVx "a" correspond to the divisor value applied for one polarity of the latch LOUT output, and the bits labeled DIVx "b" correspond to the other polarity. For even final divide values, the "a" and "b" bits are the same, but for odd final divide values the "a" and "b" bits differ by one divide value.

In FIG. 11, the functional circuit block labeled "DIV MODE" 118 controls the divide value of the LFSR 116. The DIV MODE circuit 118 will generate the DIVx "a" and DIVx "b" values and pass these bits to the LFSR 116 through the outputs DO[0:3]. The DIVx bits are derived from the inputs DI[0:3], whose values for the various divide modes are the same as the DIVx "a" divide values. For an even final divide value, (i.e.: 2, 4, 6, etc.) the circuit passes the values of the inputs DI[0:3] to DO[0:3]. In this case, the EVENIODD input is held at a logic "0' level. On the other hand, for odd final divide values, (i.e. 3, 5, 7, etc.) the circuit passes the inputs DI[0:3] to DO[0:3] only when the output of the LOUT value is high. This latch output level is detected via the LOW|HIGH input. When the latch output is low, the outputs DO[0:3] will be adjusted to reduce the LFSR divide value by 1. This is accomplished by shifting the inputs DI[0:2] to outputs DO[1:3]. The output DO[0] is the logical XOR (exclusive OR) gate 119 of DI[2] and DI[3] shown in FIG. 13. This logic mimics the operation of the LFSR. Indeed, the logic setting output DO[0] is identical to the feedback network of the LFSR 116. If the feedback network in the LFSR 116 changes, the DO[0] logic shown would need to be reconfigured as well.

Figure 13:
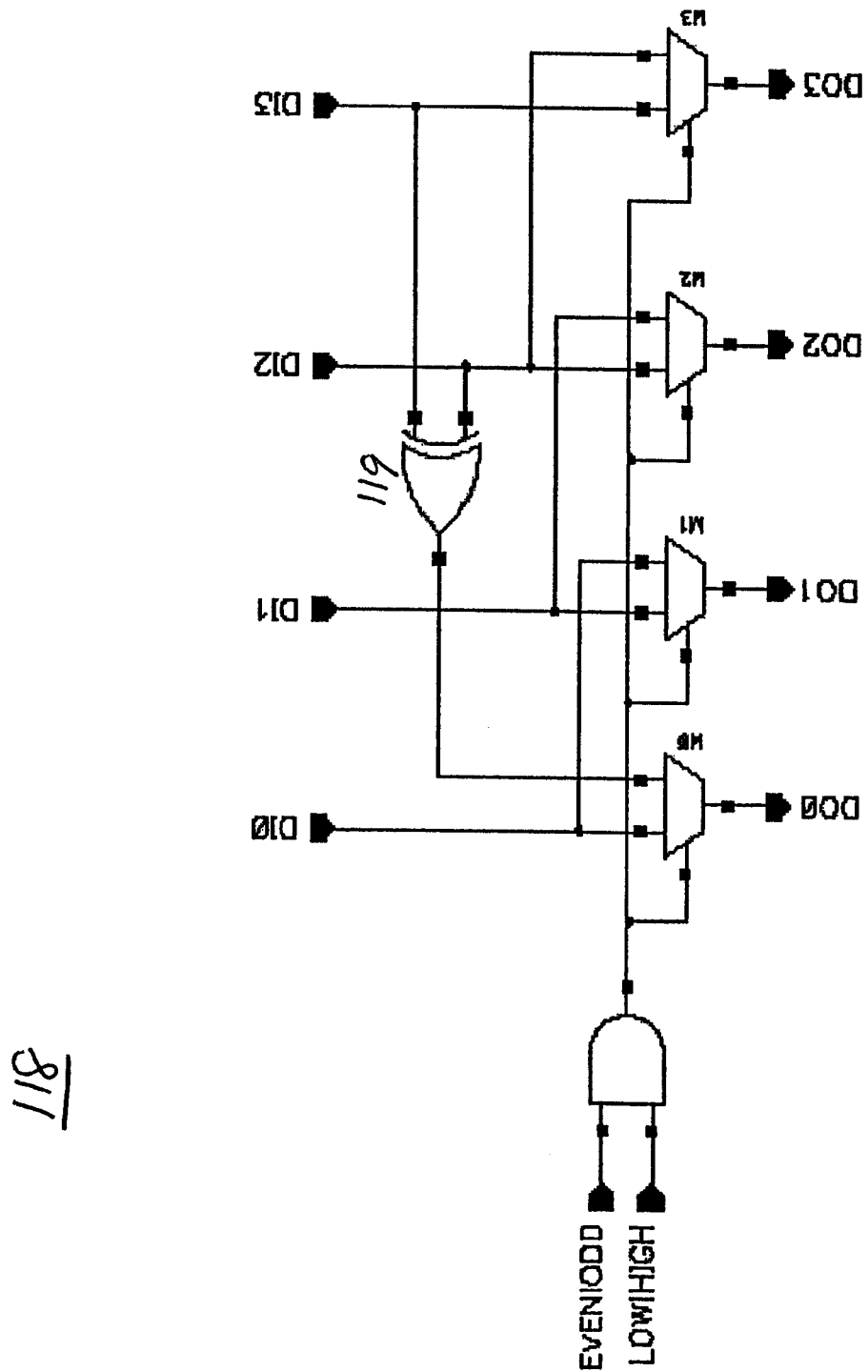
FIG. 13 depicts a logic schematic for the divide mode controller of FIG. 11.

FIG. 13 shows an exemplar DIV MODE circuit 118 that can realize all final divide values except divide-by-three. In this case, the LFSR will alternate between the divide values 2 and 1. The LFSR inputs DIV[0:3] for these divide values are "1111' and "0000', respectively. The divide value corresponding to "0000' cannot be generated by shifting and XORing divide values corresponding to the "1111' binary sequence. For a divide-by-three circuit, additional logic would be required, but is omitted here for this example.

For odd final divide values, the divide value of the LFSR 116 alternates with the output of the latch, LOUT 115. Taking the case of final divide value of 5, the LFSR 116 alternates between divide values of 3 and 2. That is, the LFSR 116 outputs one pulse for three input clock cycles, then one pulse for two input clock cycles. The output of the symmetrical divide-by-two circuit is a signal that is high for three cycles and low for two cycles, for a total of five input clock cycles. While this output reflects a final divide of five, the LOUT latch 115 does not produce a 50% duty cycle.

Figure 14:
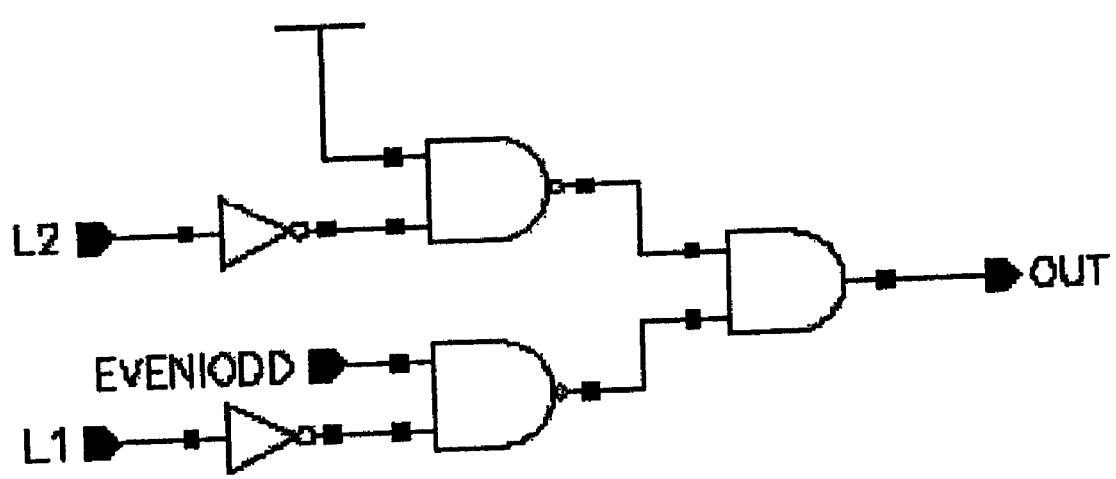
FIG. 14 illustrates a logic schematic of the duty cycle correction unit of FIG. 11.

The logic circuit 114 shown in FIG. 14 may be used to realize an output with a 50% duty cycle. This circuit corresponds to the Duty Cycle Correction (DCC) functional block 114 shown in FIG. 11. The DCC circuit accepts the outputs of a master-slave latch. The output of the master side is L1 and the output of the slave side is L2. These latch components are identical except for being triggered by opposite edges of the clock. As such, output L1 will change one-half clock cycle before output L2. With respect to odd final divide modes, both the L1 and L2 latch (LOUT) outputs are held high for one clock cycle more than they are held low. Since L1 And L2 are phase-shifted by one-half of a clock cycle, logically ANDing them together will create an output with a 50% duty cycle. For the even divide modes, the latches already produce an output 50% duty cycle, the EVENIODD input would be low and only the L2 signal passes to the output.

The LFSR frequency divider shown in FIG. 11 and FIG. 13 has a range of divide-by values of 1–16 and divide resolution of 1. The number of divide values or divide modes is therefore 16. By operating the LFSR 116 in series with the divide-by-two circuit 115, the divide range doubles to 2–32 and the resolution also doubles. The number of divide modes, however, stays the same. By increasing the resolution using the techniques described above, the number of divide modes doubles as well to 32. In order to program 32 modes, five programmable control bits are needed. FIGS. 11 and 13 show four programmable DIV[0:3] bits and an EVENIODD bit. The EVEINIODD bit is the fifth programmable control bit. The table in FIG. 15 lists the 32 divide values and the corresponding values of the control bits, DIV[0:4].

Figure 16:
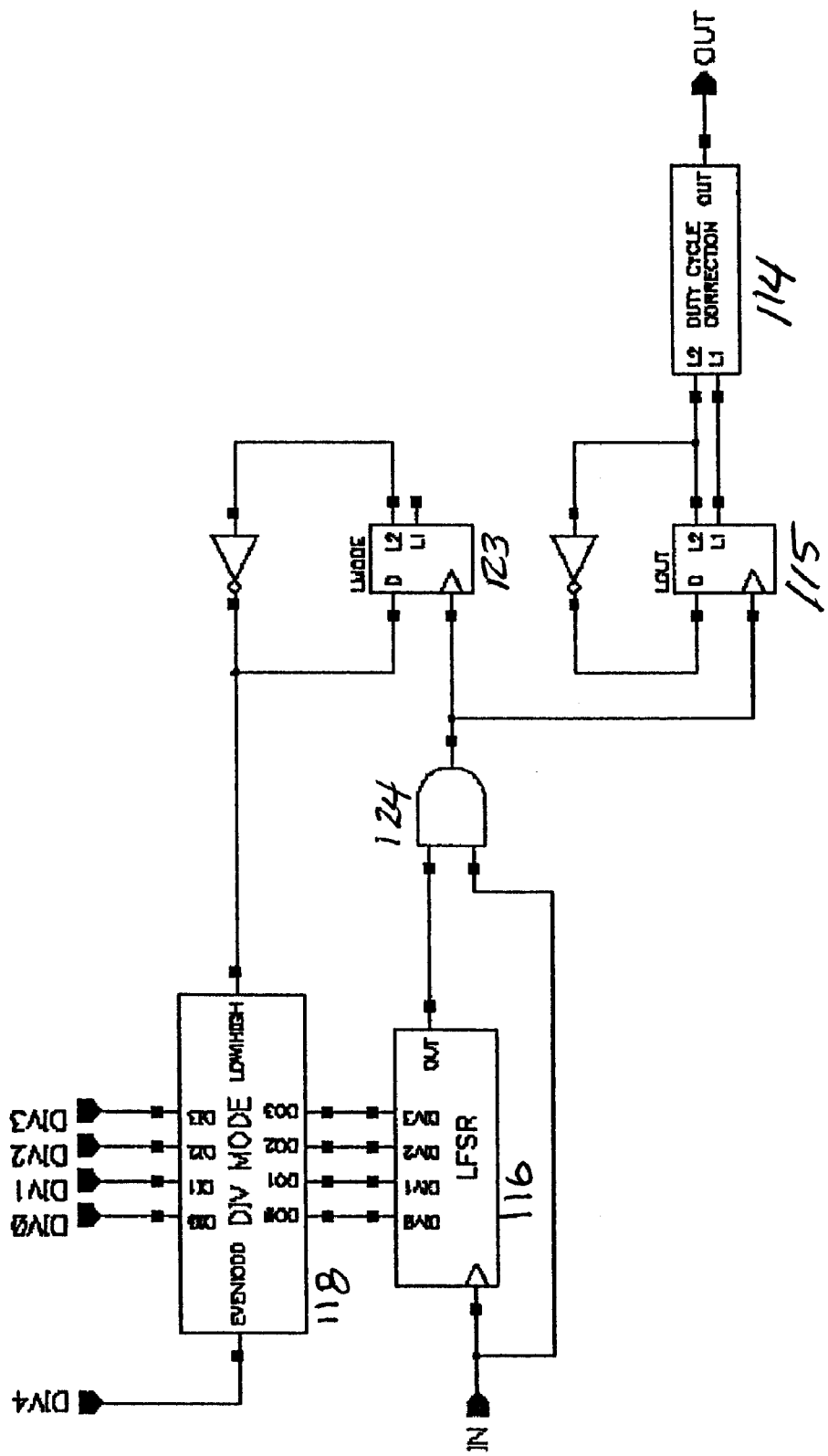
FIG. 16 depicts a frequency divider circuit incorporating an additional latch to control the divide mode controller.

In order to increase performance, the divider can be modified as illustrated in FIG. 16. In this design, the latch, LMODE 123 is dedicated to controlling the divide value of the LFSR 116. This latch does not drive the duty cycle correction circuit 114, therefore the loading on the latch LMODE 123 outputs is reduced, and more time is available to adjust the divide value. In addition, the output of the LFSR 116 does not drive the output latches directly, but is used to mask the input clock. The output latches therefore see essentially the same clock as the LFSR 116 with only the added delay of an AND gate 124. This delay is certainly less than the delay through the LFSR 116 itself. By synchronizing the operation of the LFSR 116 with the output latches, particularly LMODE 123, the amount of time available to adjust the divide value of the LFSR 116 is increased even further.

The examples above have focused on an LFSR with 16 divide modes and a symmetrical divide-by-two circuit. The invention is not limited to component dividers of this size. Indeed, probably the most significant advantage of using this invention is that the size of the LFSR component can be increased without impacting the performance of the series combination of dividers. This is owed to the essential nature of the LFSR as a modified shift register. Consequently, the size of the LFSR can increase without adding significant overhead to critical data path logic. In this regard, the LFSR can readily serve as the workhorse of the divider, providing in excess of 1000 divide modes.

Figure 17:
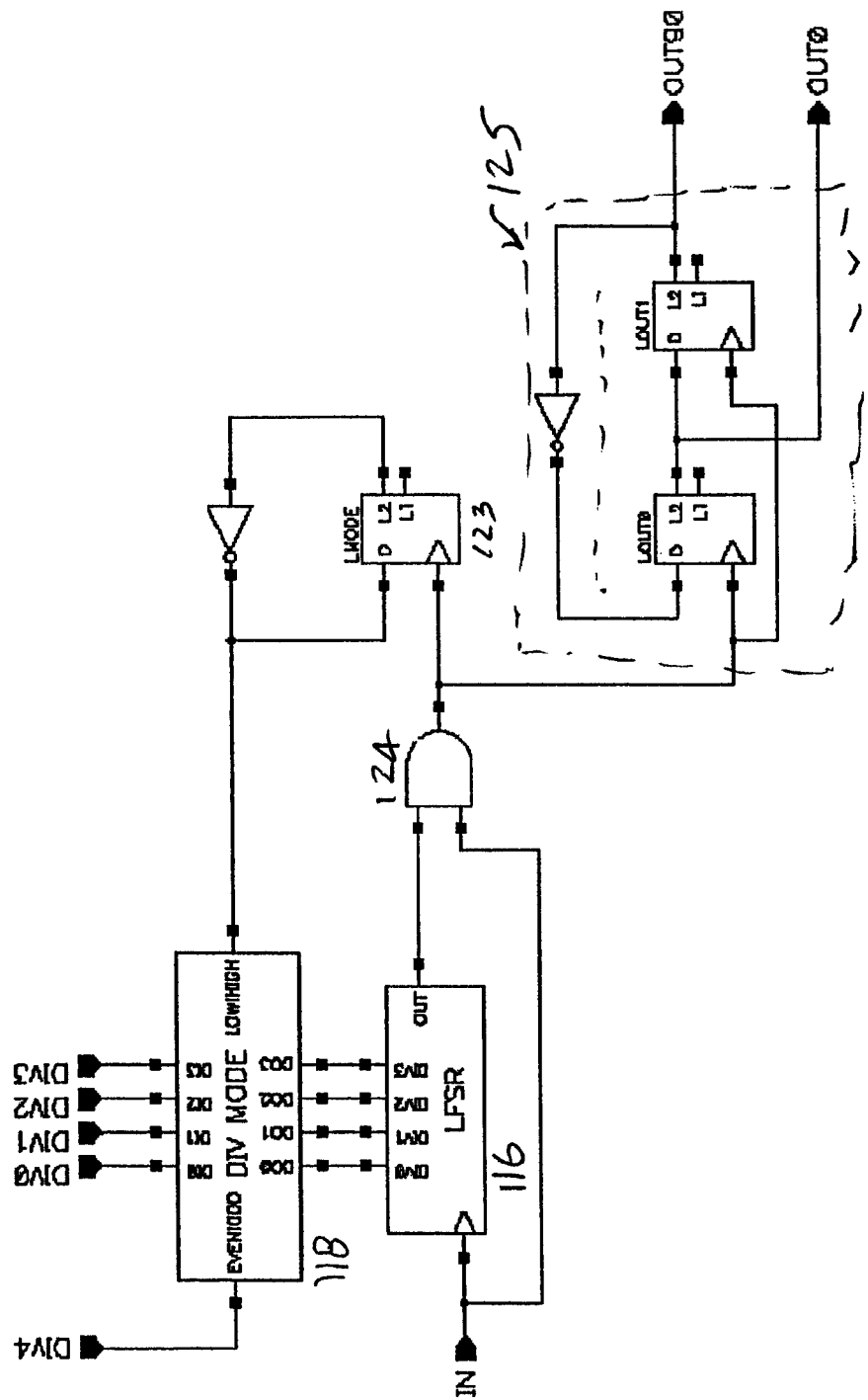
FIG. 17 depicts a frequency divider circuit wherein the symmetrical divider of FIG. 16 is replaced with a symmetrical divide-by-four component.

Since the LFSR can perform the bulk of the division specified by the final divide value, the purpose, of the symmetrical divider, in most cases is to provide a symmetrical output with a 50% duty cycle. The simple divide-by-two circuit 115 shown in FIGS. 11 and 16 is suitable for this task. However, other symmetrical divider circuits may be used to perform another essential function: the generation of multiple phase-spaced outputs. As shown in FIG. 17, for example, the symmetrical divide-by-two circuit may be replaced by a symmetrical divide-by-four circuit 125. With the divide-by-two circuit, the output will complete one cycle for every two pulses issued by the LFSR 116. With a divide-by-four circuit, the output will cycle once every four pulses. The pulses are therefore 90 degrees apart. This phase-spacing attribute can be exploited by tapping the outputs of both latches in the divide-by-four circuit 125. The transitions of these outputs will also be 90 degrees apart.

Figure 18:
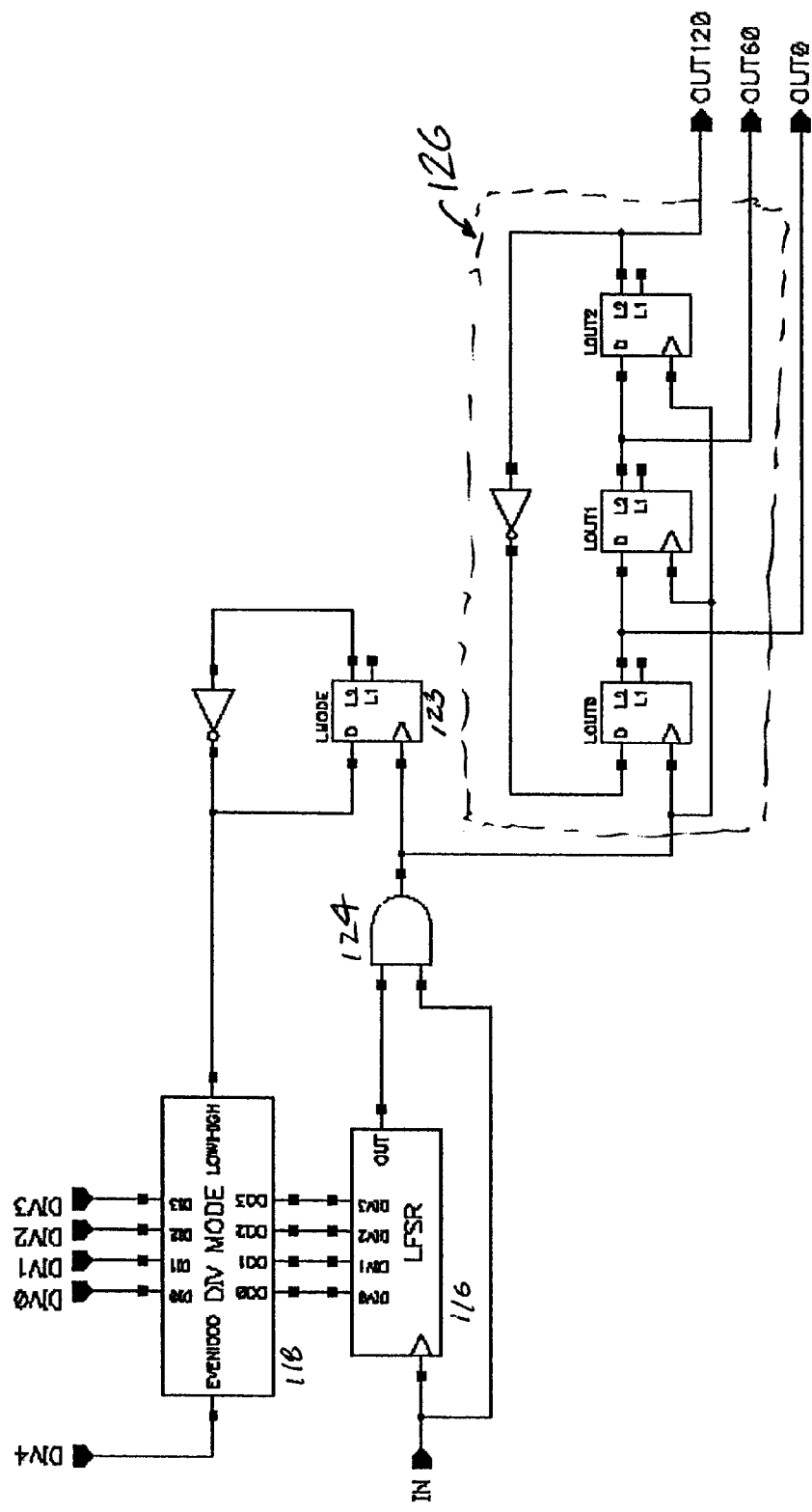
FIG. 18 depicts a frequency divider circuit wherein the symmetrical divider is a symmetrical divide-by-six component.

Similarly, FIG. 18 illustrates a divide-by-six circuit 126. Accordingly, the output of the symmetrical component will cycle once every 6 pulses issued from the LFSR 116. The pulses are therefore 60 degrees apart, and the output of the latches in the symmetrical divider will be 60 degrees apart as well.

By increasing the divide value of the symmetrical divider component, the divider resolution of the series combination of dividers also increases. With a symmetrical divide-by-two divider component, the available divide values for the series combination are 2, 3, 4, 5, etc. The minimum divide value is actually 1, but the enabling circuitry has not been shown. With respect to a symmetrical divide-by-four component, the available divide values are 4, 8, 10, etc., and in respect to a divide-by-six component, the divide values are 6, 9, 12, 15, etc, For some divide values, additional adjustments are necessary to provide proper phase spacing. For example, if a divide-by-four component is used to produce a final divide value of 10, the LFSR must alternate between divide values of 3 and 2 (2.5×4= 10). This means the LFSR would issue a pulse for three input clock cycles, then a pulse for two input clock cycles. These pulses do not have a consistent phase spacing, so without compensating for it, this inconsistency would be propagated to the outputs. The separation between output pulses in this case should be 2.5 clock cycles, but in the circuit shown in FIG. 18 the outputs would be three input clock cycles apart.

Figure 19:
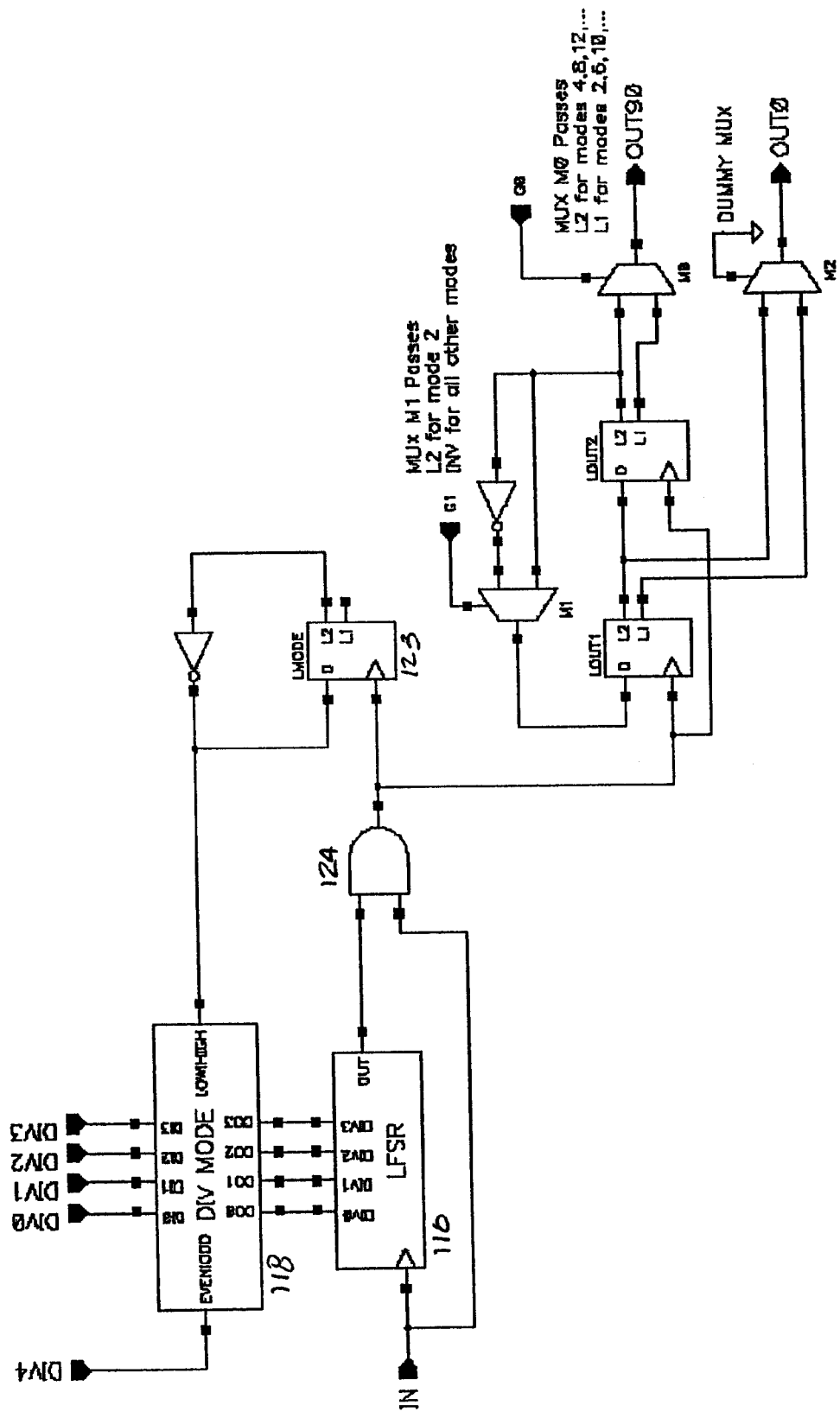
FIG. 19 illustrates a frequency divider with phase spacing correction.

A circuit implementation to overcome the problem of inconsistent phase spacing is presented in FIG. 19. For a divide-by-four component, a correction to the phase spacing needs to be made only for the final divide values of 6, 10, 14, 18, etc. In these divide modes, the output OUT90 is in error by a positive input half cycle. The phase can be corrected by passing via MUX M0, the L1 output of latch LOUT2 to the output OUT90 instead of the L2 output.

In addition, the divide value of the symmetrical divider may be reduced from four to two via MUX M1. This will restore the final divide value of two. With the symmetrical divider component operated in the divide-by-two mode, the odd divide modes may be restored. However, for the odd divide modes the 90 degree phase shifted output OUT90 would be invalid. The final divide value of one may also be restored with additional logic and the output OUT90 would be invalid for this case as well.

Similar adjustments can be made to the divider circuit design using a symmetrical divide-by-six divider component, or components with other divide values.

Another aspect of the present invention is the ability to seamlessly operate multiple dividers with different divide values in parallel. For applications requiring a multiple frequency divider configuration, the dividers share the same input clock but the phase relationship of the output clocks is often an issue. This is because the outputs of a multiple divider are typically required to be phase aligned, such that the outputs transition at the same time. When all the dividers are operated with the same divide value, the output clocks exhibit the same frequency and phase alignment is easily accomplished. However, the difficulty arises when different divide values are specified for individual dividers causing the output frequencies to be different. The frequency divider of the present invention has the capability of realizing phase alignment across all of the divider outputs in a multiple divider configuration because the LFSR component will maintain the same state prior to issuing an output pulse.

For example, if the LFSR is initialized in the all "ones" state corresponding to a final divide value of three as shown in FIG. 15, a pulse is guaranteed to issue on the next clock cycle. If the symmetrical divider component is a divide-by-two circuit, the pulse will by definition cause a transition of the output clock. If the LFSRs of all of the multiple dividers are initialized to the all "ones" state then all of the dividers will issue a pulse on the clock cycle following initialization and all of the outputs will transition at the same time. In this regard, a rising or falling transition may be aligned by properly initializing the divide-by-two circuits.

The outputs of dividers with symmetrical components can also be aligned. The technique described above merely requires the symmetrical component transition occur with the first pulse of the LFSR, which may be accomplished through appropriate initialization.

The divider initialization must occur to achieve phase alignment of the outputs. This requires a reset signal and the ability to initialize the latches in the divider, which are easily implemented with prior art techniques.

In addition to phase aligned outputs, many applications also require a signal indicating when the alignment has occurred, which can be difficult to ascertain. This is because generating an alignment signal usually requires detecting the output transitions after they occur. Consequently, a delay will exist between the transition time and the time at which the alignment signal is launched.

Another aspect of the present invention is that an alignment signal can be launched simultaneously with the transition of the outputs because the output will transition one clock cycle after the LFSR issues a pulse, which is the cycle immediately prior to the output transition. If all LFSR circuits simultaneously launch a pulse, then all outputs will transition on the next clock cycle.

Figure 20:
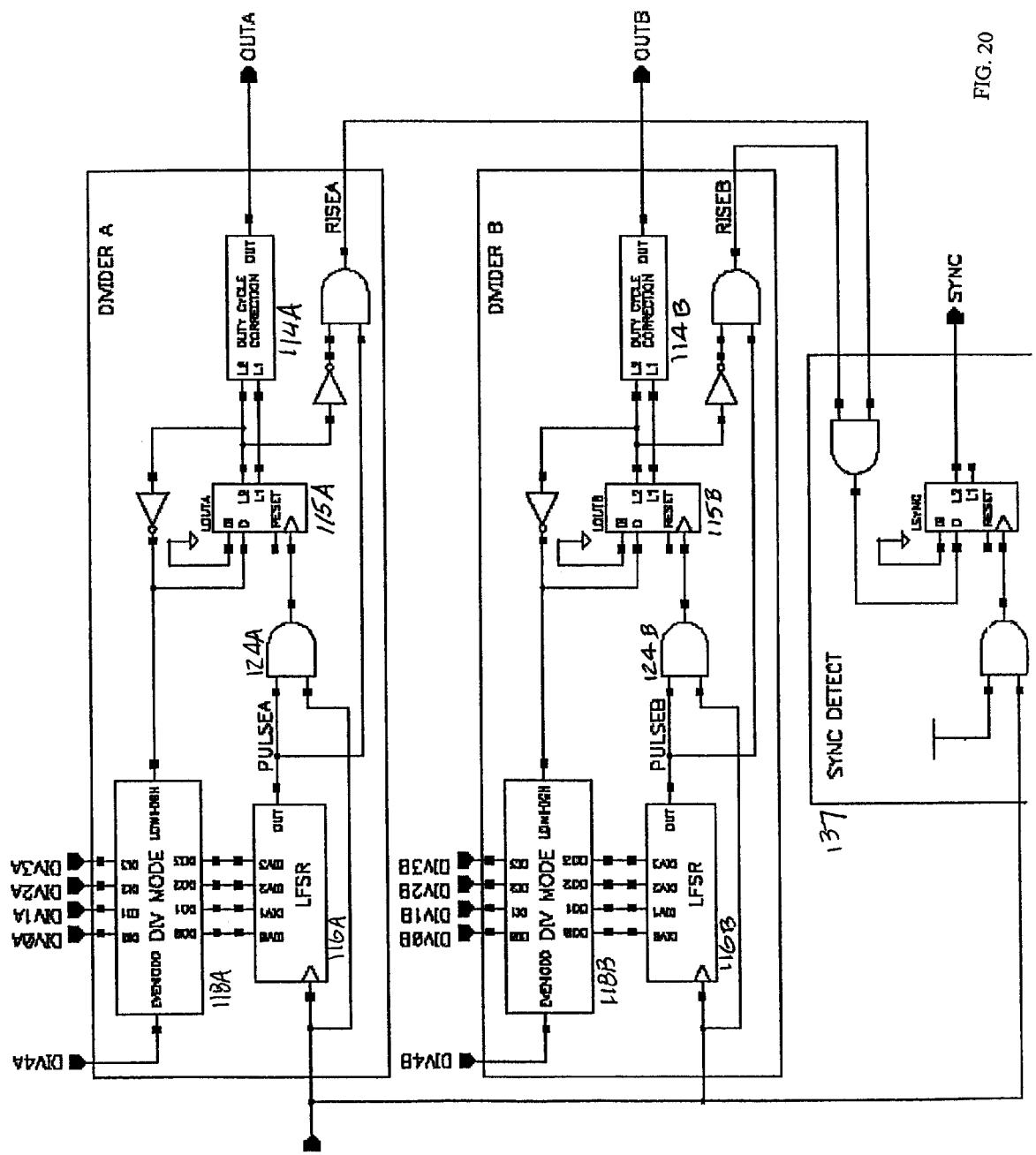
FIG. 20 illustrates a multiple frequency divider with an alignment signal to detect rising edge alignment.

Following the launch of a pulse by all of the LFSR circuits, the outputs will transition on the next clock cycle. This transition may be high or low depending on the initialization values of the symmetrical divider. In order to generate either a rising or falling edge transition signal, the level of the output must be considered. A multiple divider design with a rising edge alignment signal is illustrated in FIG. 20. The latches LOUTA 130, LOUTB 131 and LSYNC 132 include a RESET input and an initialization input. When the RESET is asserted, the latch will be set to the level driving the initialization input, in this case GND.

For each divider shown in FIG. 20 (DIVIDER A, DIVIDER B), the pulse issued by the LFSR is detected and compared with the output of the divide-by-two circuit. If the pulse is high and the output is low, then the output OUT will rise on the next clock cycle. This is indicated by the RISE signal for each divider. Accordingly, when the RISE signal for each of the dividers goes high, the OUTA and OUTB output signals will rise on the next clock cycle. The SYNC DETECT circuit will detect this condition and on the next clock cycle issue an alignment signal or a SYNC signal that will rise at the same time the outputs rise. The SYNC output will remain high for one full clock cycle of the input clock. In the embodiment shown in FIG. 20, two parallel dividers are implemented, however, the SYNC detect circuit may be adapted to handle more than two parallel dividers.

A similar technique may be used to change divide values during operation of the divider without incurring glitches or spurious intermediate output frequencies. By exploiting the fact that the inputs that control the divide value have no effect until a pulse is launched, the divide values may be changed in mid-processing. When the LFSR issues a pulse, the control inputs are loaded in the LFSR latches. This means that any change to the divide value of the LFSR will be synchronized with the LFSR pulse. Once the inputs change, the LFSR will immediately divide by the new value following the next clock cycle. As such, the frequency of the LFSR pulse will change seamlessly. Accordingly, on the LFSR pulse following the clock cycle where the input values changed, the frequency will immediately change to the new value specified by the input changes without any glitches or intermediate frequency values.

Figure 21:
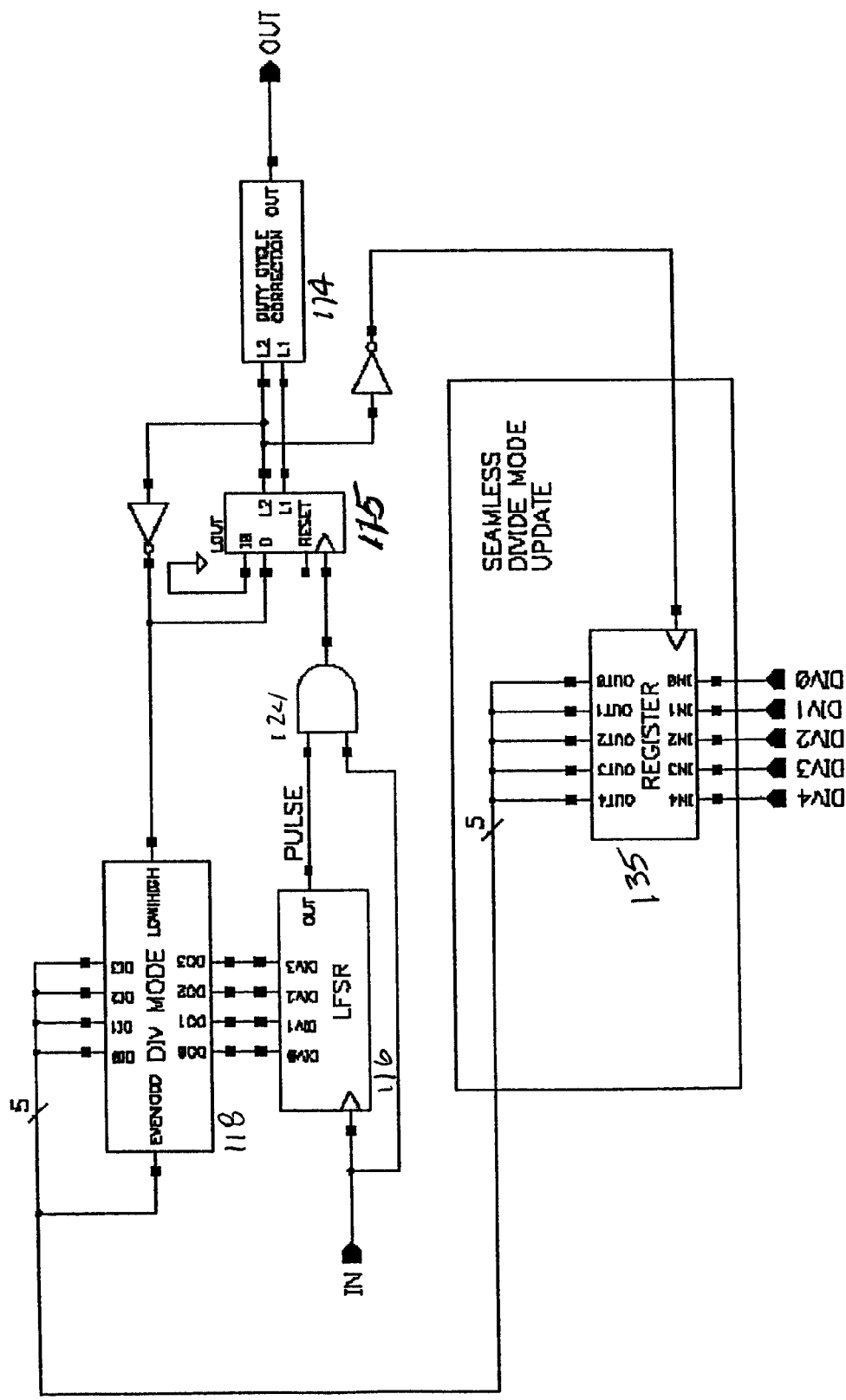
FIG. 21 shows a frequency divider circuit capable of seamless changing of divide modes.

Since OUT will transition one clock cycle after the LFSR pulse, if the frequency of the pulse changes seamlessly, then the frequency of the OUT transition will be seamless as well. However, if the frequency of a particular transition is required to change seamlessly, then the level of OUT must be considered prior to a change in frequency. For the rising edge frequency to change without glitching, the frequency of OUT must change after a rising edge and not after a falling edge. This sequence is ensured by gating the inputs to the divider with the OUT signal as illustrated in FIG. 21. In this case, to improve performance, the output LOUT is used rather than OUT.

The REGISTER element 135 in FIG. 21 holds the values of the DIVx input bits and releases new values on a rising edge of its input clock. The REGISTER element 135 is not part of the present invention.

As shown in FIG. 21, if the DIV inputs are updated on the falling edge of OUT, they will not take effect until after the next LFSR PULSE signal. After the PULSE signal is updated, OUT will go high, and the LFSR 116 will load in the new inputs and begin dividing by the new divide value. Note the time between the falling edge of OUT and the falling edge of PULSE is the time available for the inputs to propagate through REGISTER 135 and DIV MODE 118 in to LFSR 116.

Still another aspect of the present invention is the ability to seamlessly change divide modes while maintaining phase alignment with the output of other dividers in a parallel configuration. This feature is realized because the LFSR control inputs are reloaded into the LFSR latches following the launch of each PULSE signal. These inputs control the divide value for the circuit, and one cycle later OUT will transition. If multiple dividers operated in parallel are synchronized, then one cycle prior to phase alignment, all of their respective LFSRs will issue a PULSE signal and reload their control inputs. Any changes to the control inputs during this interim will result in the divider outputs transitioning one clock cycle later. However, following this transition, the output frequencies of the affected dividers will change. Since this change is made concurrently with the change to the control inputs the phase alignment will be maintained.

In multiple divider topologies, when the LFSR pulse signals coincide, the divider outputs will change every transition, but perhaps not in the same direction. The outputs may all rise or all fall or may exhibit a combination of both rising and falling outputs. To ensure a uniform phase alignment for the outputs, the logic level of the divider outputs must be considered before changing the divide values.

Figure 22:
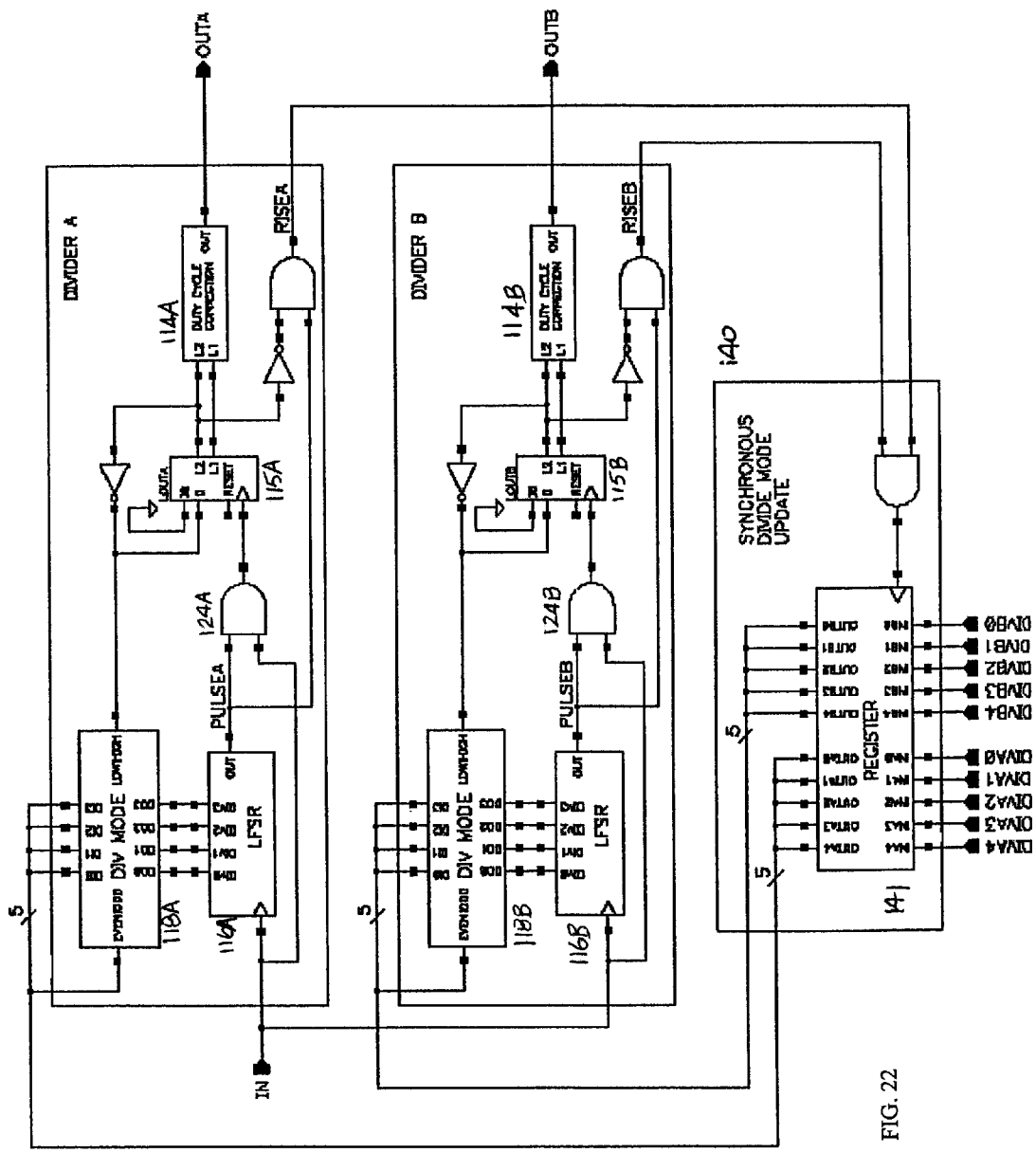
FIG. 22 illustrates a dual frequency divider circuit topology for changing divide modes while maintaining edge alignment of the divider outputs.

FIG. 22 illustrates a technique for changing divide modes while maintaining the rising edge alignment of the divider outputs. For each divider, the pulse issued by the LFSR is detected and compared with the level of the output latch. If the pulse is high, and the output is low, the divider output OUTx will rise on the next clock cycle. This transition is indicated by the RISEx signal. When the RISE signals for both dividers (RISEA and RISEB) evaluate high, OUTA and OUTB will rise on the next clock cycle. The circuit SNY-CHRONOUS DIVIDE MODE UPDATE circuit 140 detects the rising transition of RISEA and RISEB and asserts a rising clock edge to the clock input of REGISTER 141. REGISTER 141 holds the values of the divider control inputs and updates the control inputs on the rising edge of the clock. Consequently, the control inputs of the dividers will only change when (a) all of the LFSR pulses are simultaneously high, and (b) rising alignment is expected on the next cycle. This means that any changes to the frequency of the divider outputs will take effect immediately after alignment and ensures continued phase alignment.

The LFSR Counter

Figure 2:
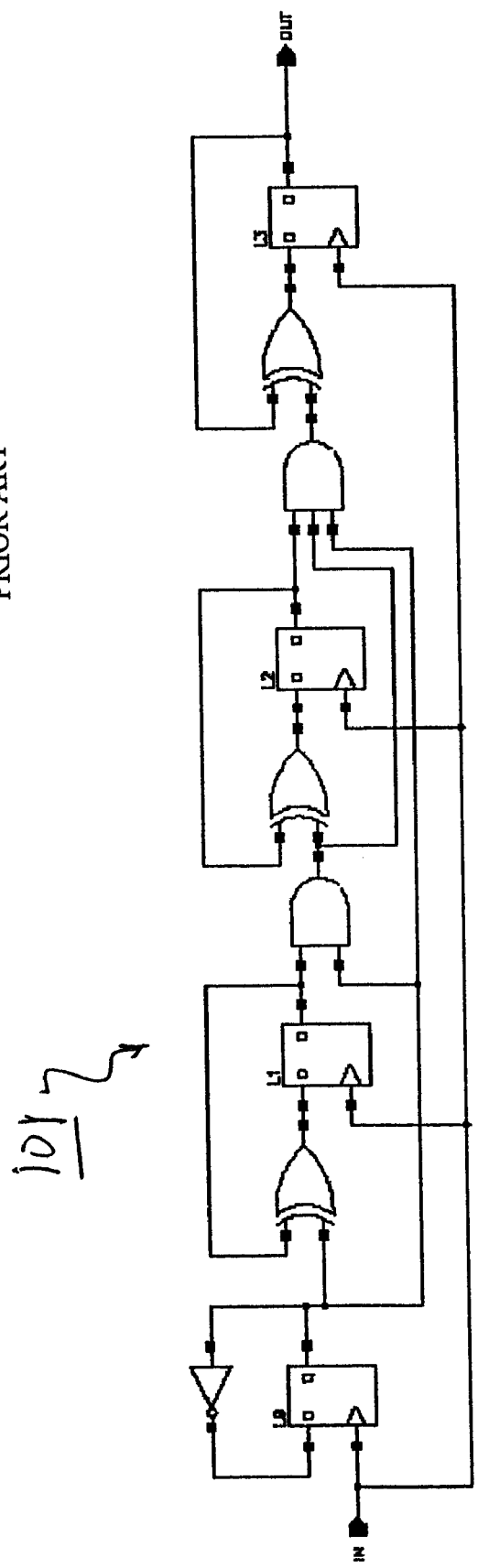
FIG. 2 illustrates a prior art binary sequential counter frequency divider circuit.
Figure 3:
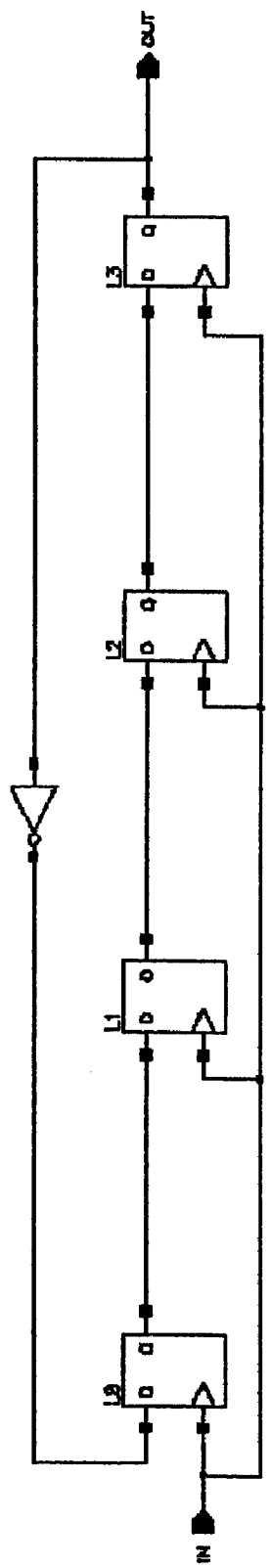
FIG. 3 shows a prior art shift register based frequency divider circuit.
Figure 5:
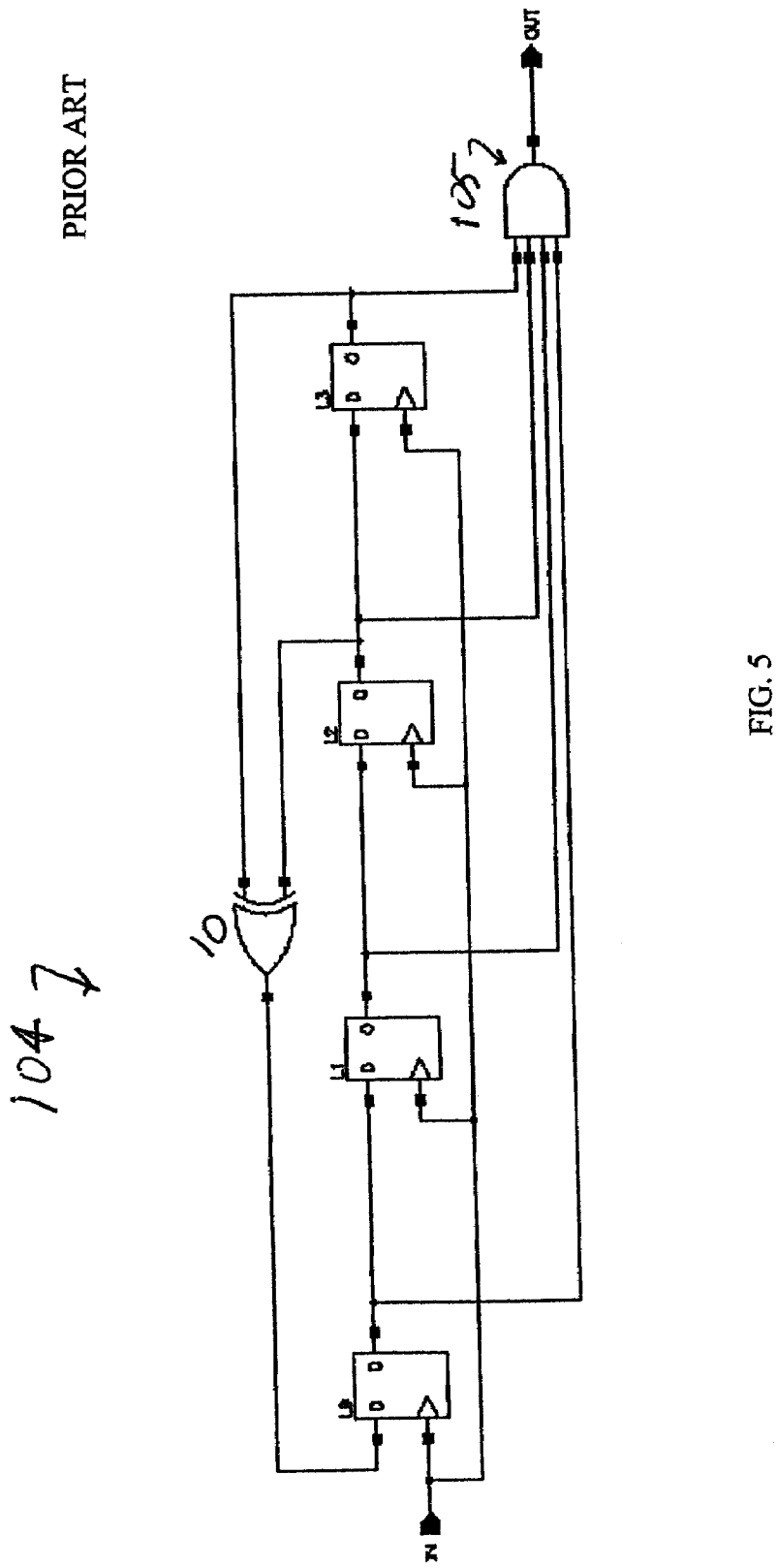
FIG. 5 illustrates a prior art LFSR based divider circuit.

A conventional four latch LFSR is illustrated in FIG. 5. The LFSR will cycle through a maximum of $2^4-1=15$ states before repeating. The maximum count is achieved by feeding back selected latch outputs through an XOR network to the register input. The feedback is a necessary component of the LFSR style counter because the LFSR will not cycle in any particular order. In a four stage LFSR, the outputs of only two latches are required to generate the signal indicating that the LFSR has cycled through all unique states. For this case, a single XOR 10 gate is necessary to realize the feedback network.

Figure 23:
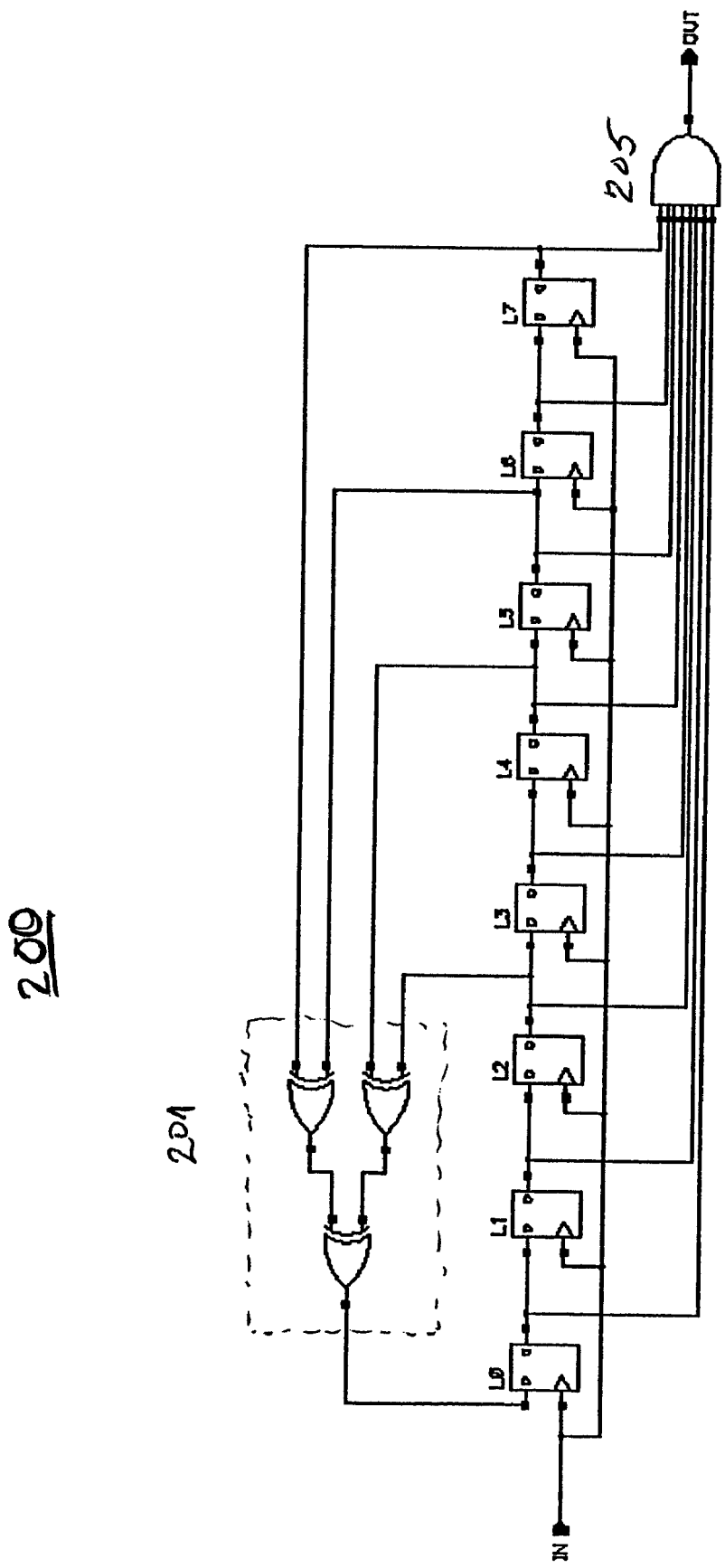
FIG. 23 shows a prior art eight latch LFSR with an XOR feedback network.

As the number of states increases, the number of latch outputs required to drive the feedback network increases, but not linearly. As shown in FIG. 23, with an eight latch LFSR 200 implementation the number of latch outputs required to realize the feedback network increases to four, which corresponds to three XOR gates 201 and a total number of unique states equal to $2^8-1=255$.

Since an XOR logic gate is a multi-stage logic function, the delay through two XOR gates can become significant for high frequency applications. To reduce the latch-to-latch delay, the XOR feedback function may be distributed across multiple clock cycles. FIG. 25 shows an eight latch LFSR 210 where latch L0 will be loaded with the XOR 203 of two of the four needed latch outputs and the XOR 203 of the other two outputs will be stored in a new latch L0B. The contents of latches L0 and L0B will be XOR'ed 204 during the next clock cycle. This circuit topology results in a latch-to-latch operation that includes a maximum of only one XOR function rather than two.

Figure 24:
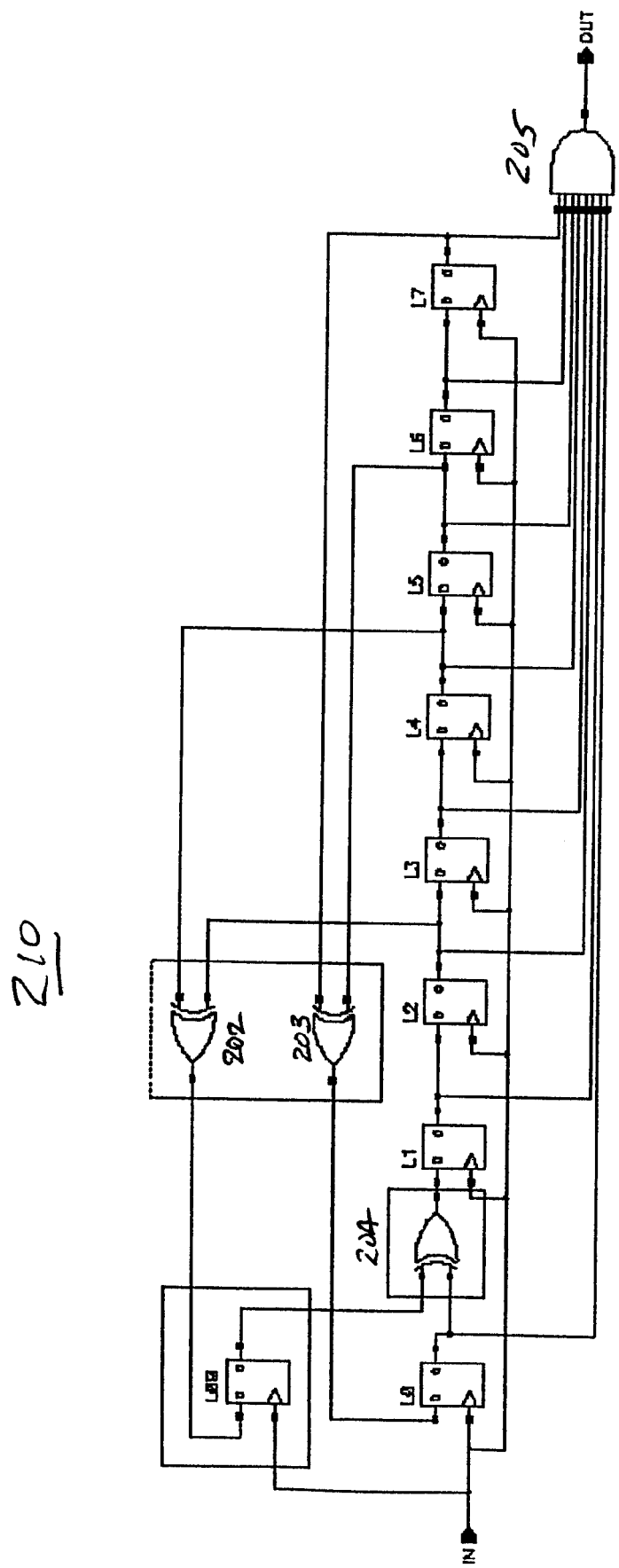
FIG. 24 shows an eight latch LFSR with a multistage XOR feedback network distributed across multiple latches.

Because the logical XOR is distributed across two clock cycles, it is possible that the latch L0 will not reflect the value it would have had in the original single cycle feedback network of FIG. 23. With the modified feedback structure, latch L0 will now occasionally contain a known "false" value that will be corrected during the next clock cycle via the XOR 204 between latches L0 and L1 in FIG. 24. The table 206 in FIG. 26 illustrates the progression of several LFSR states. These same states are listed in the table of FIG. 25.

With the conventional LFSR implementation of FIG. 23, the contents of the latch L0 for state 64 is "0", while the table 206 in FIG. 26 corresponding to the modified LFSR of FIG. 25 indicates a value of "1" for state 64. This is a false value that will be updated to the correct state value during the subsequent clock cycle.

The only concern with this technique is whether the "false" value of L0 will propagate a false "1" to the output of the AND gate 150. In that event, the output of the AND gate 205 would not reflect the proper count of the LFSR. For the design shown in FIG. 25, this could occur only if latch L0 contained a false "1" at the same time the latches L1–L7 contained all ones. This result is not likely because latch L2 or latch L4 would have had to contain a "0" at the end of the previous clock cycle in order to pass a "1" on the subsequent clock cycle. If either Latches L2 or L4 contained a "0", it would still be held in another latch on the next clock cycle and therefore the AND gate 205 would not be able to issue a false "1". Note that the logic used to drive the LFSR output and detect a unique state may be different than the AND gate 205 shown in FIG. 25. In that case, the designer must ensure the detected state is not vulnerable to false values.

Figure 27:
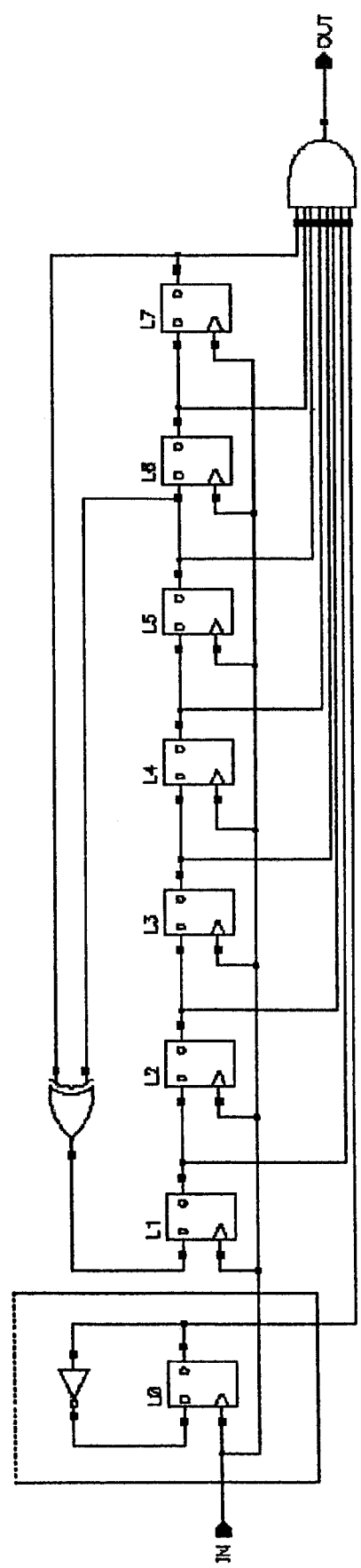
FIG. 27 illustrates a seven latch LFSR coupled in parallel with a divide-by-two symmetrical counter.

Another circuit embodiment for the LFSR counter which reduces the number of series XOR devices in the feedback network is illustrated in FIG. 27. A seven latch LFSR is operated in parallel with a single latch divide-by-two element. The parallel configuration is realizable because the divide-by-two element has an even count of states and the LFSR, by definition, has an odd count. The state transition table 210 shown in FIG. 28 corresponds to a divide-by-two operated in parallel with a dual latch LFSR (L1, L2). For state 1, L0=0 and L=1 and the divide-by-two state is "1". When combining the two circuits, the number of unique states is equal to the number of LFSR states $2^2-1=3$ multiplied by the number of states of the divide-by-two element (2), for a total of 6 states.

By comparison, if the LFSR had an even number of states (which it cannot), the progression of states for the parallel combination of the LFSR and a divide-by-two would correspond to the table shown in FIG. 29. Each time the LFSR repeats a state, the divide-by-two element also repeats a state. The result is that the total number of states is only $2^2=4$. That is, if the LFSR had an even number of states, operating in parallel with a divide-by-two element would not increase the total number of states.

Figure 30:
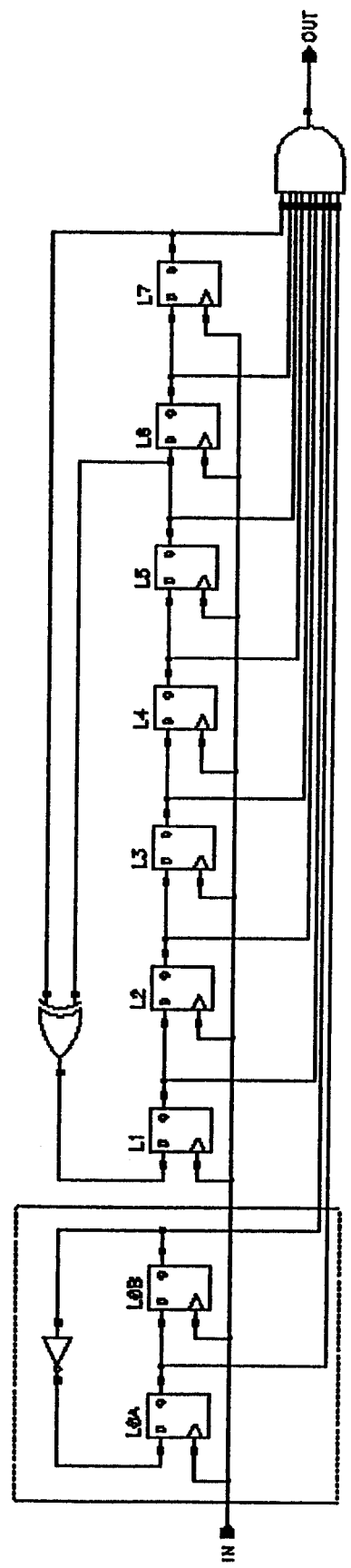
FIG. 30 illustrates a seven latch LFSR operated in parallel with a divide-by-four latch pair.

The embodiment shown in FIG. 27 is a seven latch LFSR operating in parallel with a single latch divide-by-two element. However, this parallel configuration technique applies to any combination of counters where the greatest common multiple of the individual counts equals one. For example, the divide-by-two element has a total state count of two and the seven latch LFSR has a total state count of $2^8-1=255$. The greatest common divisor in this case is one. In FIG. 30, a divide-by-four element is substituted for the divide-by-two element which yields a greatest common divisor of the individual state counts (4, 255) equal to one. A divide-by-four element can therefore be operated in parallel with an LFSR and the combination will provide the theoretical maximum count for the given configuration.

In general, any even $2^m$ counter, where m is the number of latches in the even counter may be operated in parallel with any odd $2^n-1$ LFSR, where n is the number of latches in the LFSR. The total count of the parallel combination equates to $2^m(2^n-1)$. As inferred from this equation, a minor drawback of this technique is that an m latch even counter operated in parallel with an n latch LFSR will not result in a $2^{(m+n)}$ counter. This is due to the LFSR losing a state, $2^n-1$ versus $2^n$. For example, an eight latch LFSR can provide a maximum state count of $2^7-1\times 2^1=127\times 2=254$. A typical non-LFSR based counter (state machine, ripple-bit, etc.) could provide a state count of $2^8=256$. However, the LFSR based counter can operate much faster than typical counter designs, and the parallel combination of an even counter and an LFSR counter can operate much faster still.

A third embodiment of the LFSR based counter distributes a single XOR feedback network across multiple latches and therefore multiple clock cycles. The XOR element is segregated into multiple stages using standard logic gate primitives which improves latch-to-latch delay and therefore overall performance of the LFSR based counter. A four latch LFSR implementation with a single XOR feedback network is shown in FIG. 5.

Figure 31:
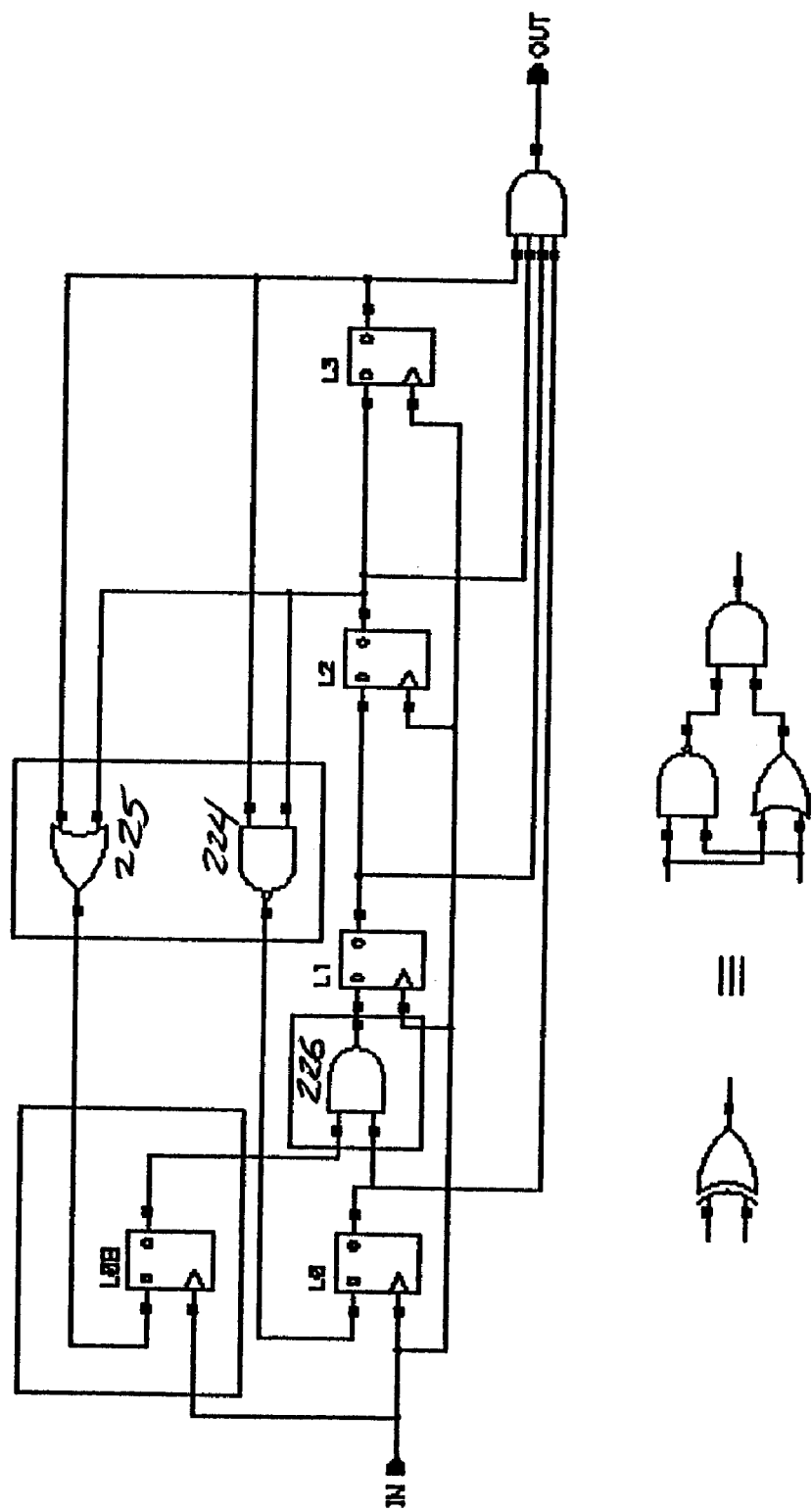
FIG. 31 shows a four latch LFSR incorporating a pipeline latch to distribute the XOR feedback network across multiple latches.

FIG. 31 illustrates the technique of splitting the XOR function into a multi-stage function and distributing the logic across multiple latches. Initially, the output of the OR component 225 is fed back to the LFSR input latch L0 and the output of the NAND component 224 is fed back to latch L0B. During the next clock cycle, the outputs of latches L0 and L0B are passed through an AND gate 226 and the result is stored in Latch L1. As in the first LFSR embodiment, latch L0 will occasionally contain a known "false" value that will be corrected when this value shifts to latch L1. FIG. 32 shows the state transition table 230 for the LFSR modified in this manner. The LFSR based counter with a segregated XOR network distributed across multiple latches will produce an accurate count provided the known false values are not propagated to the output OUT, which can be avoided by driving the output OUT with the logical AND of latches L0–L3 or similar means.

Figure 33:
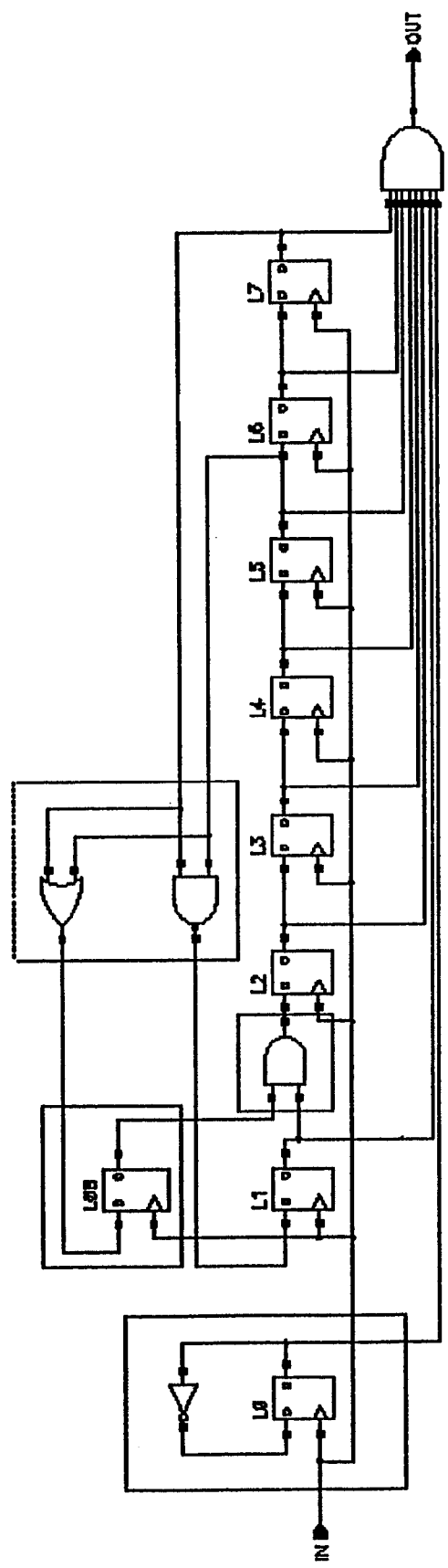
FIG. 33 shows a seven latch LFSR incorporating a pipeline latch to distribute the XOR feedback network across multiple latches coupled in parallel with a divide-by-two counter.

A fourth embodiment of the high speed LFSR component of the frequency divider of the present invention combines two of the previous techniques. FIG. 33 shows a seven latch LFSR based counter coupled in parallel with a divide-by-two element and a segregated single XOR feedback network. The total number of states was reduced from 255 to 254, but the performance was improved by implementing the feedback network with a single XOR function decomposed into its component functions, which, in turn, necessitated an additional latch L0B. The final counter design has a maximum number of states that is one less than a standard eight latch design (254 versus 255) but offers a substantial improvement in performance.

Figure 34:
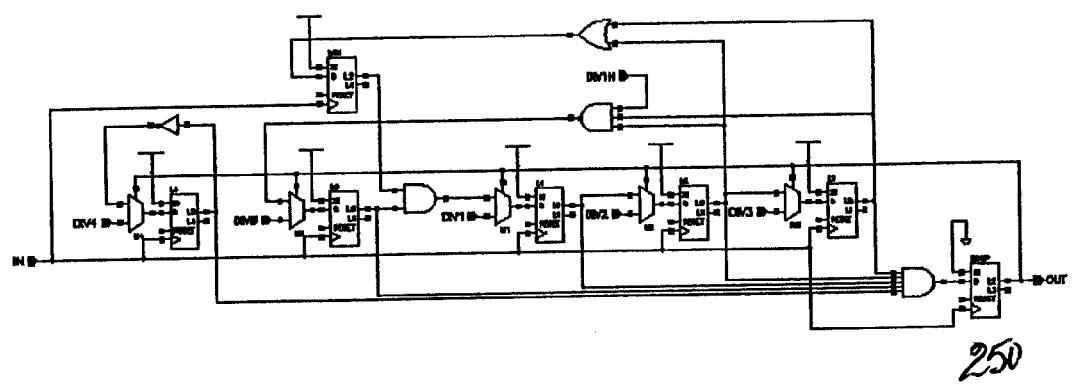
FIG. 34 illustrates a four latch LFSR incorporating a pipeline latch to distribute the XOR feedback network across multiple latches, a divide-by-two counter coupled in parallel with the LFSR, and counter initialization and reset capability.

A fifth embodiment of the high speed LFSR counter of the frequency divider, shown in FIG. 34, adds an additional programmability feature by providing a multiplexed input to each of the LFSR latches. The LFSR counter latches can be initialized to specific values via a latch RESET input. Another latch 250 is added to control the gates of the multiplexer circuits used for programming the maximum state count.

The techniques discussed herein are not limited to a particular LFSR or symmetrical divider implementations or a specific number of dividers in parallel, but may be extended to designs with dividers of virtually any size and number with modifications that are simply a natural extension of the underlying principles.

While the invention has been described in detail, the foregoing description is in all aspects illustrative and not restrictive. It is understood that numerous other modifications and variations can be devised without departing from the scope of the invention.

What is claimed is:

1. A high speed programmable divider circuit with symmetrical duty cycle, comprising:
   a division mode controller capable of specifying a binary encoded divisor value;
   a linear feedback shift register (LFSR) coupled to the division mode controller and forming a first stage divide function;
   a master-slave latch coupled in series with the LFSR and forming a second stage divide function;
   a duty cycle correction circuit coupled in series with the master-slave latch; and
   an inverter with an input coupled to a slave output of the master-slave latch and to the duty cycle correction circuit and an output coupled to the division mode controller and the data input of the master-slave latch.

2. The high speed programmable divider circuit according to claim 1, wherein the division mode controller is adapted to alternate the divisor value every clock cycle by one more or one less than a desired final divisor value for an odd numbered final divisor value.

3. The high speed programmable divider circuit according to claim 1, further comprising:
   a logic gate coupled to the LFSR output and driving the second stage divider function; and
   a latch controlling a final divide value of the division mode controller.

4. The high speed programmable divider circuit according to claim 1, wherein the LFSR comprises:
   a plurality of series coupled latch elements forming a counter capable of producing an odd number of counter states;
   a pipeline latch element coupled in parallel with one of the plurality of latch elements;
   a feedback logic network decomposed into multiple logic stages and distributed across multiple latch elements of the counter such that a latch-to-latch operational latency of the LFSR does not exceed one gate delay, the feedback logic network adapted to generate a primitive polynomial; and
   an output logic element coupled to the outputs of each of the plurality of latch elements of the counter, the output logic element capable of detecting a complete cycle of the counter states.

5. The high speed programmable divider circuit according to claim 3, wherein the second stage divide function comprises a divide-by-two latch.

6. The high speed programmable divider circuit according to claim 3, wherein the second stage divide function comprises a divide-by-four latch pair.

7. The high speed programmable divider circuit according to claim 3, wherein the second stage divide function comprises a plurality of m latches, where m is an even integer.

8. The high speed programmable divider circuit according to claim 7, wherein the second stage divide function includes a plurality of multiplexer elements to control phase alignment of an output of the divider circuit.

9. The high speed programmable divider circuit according to claim 8, further comprising:
   a second divider circuit coupled in parallel with the high speed programmable divider circuit and forming a multiple divider; and
   a synchronization circuit coupled to the multiple divider capable of detecting synchronization of output transitions from the multiple divider and generating a synchronization signal.

10. The high speed programmable divider circuit of claim 9, wherein the second divider specifies a final divisor that is different from the divisor of the divider circuit.

11. A method of performing frequency division of a digital waveform, the method comprising:
    specifying a binary encoded divisor using a division mode controller,
    forming a first stage divide function using a linear feedback shift register (LFSR) coupled to the division mode controller;
    forming a second stage divide function using a master-slave latch coupled in series with the LFSR;
    generating a symmetrical frequency division output using a duty cycle correction circuit coupled in series with the master-slave latch;
    selecting a divisor value of the LFSR as a function of a desired final divisor value to perform an even or an odd divide-by function;
    alternating the divisor value of the LFSR by one more or one less than the desired final divisor value for an odd numbered final divisor value; and
    maintaining the divisor value of the LFSR for an even numbered final divisor value.

12. The method according to claim 11 further comprising:
    changing the final divisor value synchronously with an output pulse of the LFSR.

13. The method according to claim 11, further comprising:
    forming a multiple divider circuit by operating a second frequency divider in parallel with a first frequency divider,
    synchronizing a first output and a second outputs of the multiple divider; and
    maintaining a specified phase relationship between the outputs of the first frequency divider and the second frequency divider.

14. A high speed linear feedback shift register (LFSR), comprising:
    a plurality of series coupled latch elements forming a counter capable of producing an odd number of counter states;
    a pipeline latch element coupled in parallel with one of the plurality of latch elements;
    a feedback logic network decomposed into multiple logic stages and distributed across multiple latch elements of the counter such that a latch-to-latch operational latency of the LFSR does not exceed one gate delay, the feedback logic network adapted to generate a primitive polynomial; and
    an output logic element coupled to an outputs of each of the plurality of latch elements of the counter, the output logic element capable of detecting a complete cycle of counter states.

15. A high speed linear feedback shift register (LFSR), comprising:
    a first plurality of series coupled latch elements forming a first counter capable of producing an odd number of counter states;
    a second plurality of series coupled latch elements coupled in parallel with the first plurality of latch elements, the second plurality of latch elements forming a second counter capable of producing an even number of counter states;
    a feedback logic network decomposed into multiple logic stages and distributed across multiple latch elements of the first counter such that a latch-to-latch operational latency of the LFSR does not exceed one gate delay, the feedback logic network adapted to generate a primitive polynomial; and an output logic element coupled to the outputs of each of the plurality of latch elements of the first counter and the second counter, the output logic element capable of detecting a complete cycle of the LFSR counter states.

16. The high speed LFSR according to claim 15, wherein the second counter element comprises a divide-by-two latch.

17. The high speed LFSR according to claim 15, wherein the second counter comprises a divide-by-four latch pair.

18. The high speed LFSR according to claim 15, wherein the second counter comprises a divide-by-n latch, where n is an even integer.

19. The high speed LFSR according to claim 15, wherein the feedback logic network comprises an XOR gate coupled to an output of a first LFSR latch and to the output of a second LFSR latch and to the input of a third LFSR latch.

20. The high speed LFSR according to claim 19, wherein the logic function of the XOR gate is decomposed into multiple logic stages and distributed across multiple latch elements of the first counter such that a maximum latch-to-latch operational latency of the LFSR does not exceed one gate delay.

21. The high speed LFSR according to claim 15, wherein the feedback logic network comprises:
   a network of XOR gates distributed across multiple latch elements of the first counter such that a maximum latch-to-latch operational latency does not exceed one XOR gate delay; and
   a first pipeline latch element accepting an output from a first XOR gate, the pipeline latch element being coupled in parallel with one of the first plurality of latch elements.

22. A high speed linear feedback shift register, comprising:
   a plurality of series coupled latch elements forming a first counter capable of producing an odd number of counter states;
   a second counter coupled in parallel with the first counter, the second counter capable of producing an even number of counter states;
   a multi-stage feedback logic network distributed across the plurality of latch elements of the first counter such that the maximum latch-to-latch operational latency of the first counter does not exceed one gate delay;
   a first pipeline latch capable of storing a first parallel output of a first stage of the feedback logic network, the first pipeline latch coupled in parallel with one of the plurality of latch elements of the first counter; and
   an output logic element coupled to an outputs of each of the plurality of latch elements of the first counter, the output logic element adapted to detect a unique counter state of the LFSR.

23. The high speed LFSR according to claim 22, wherein the multistage feedback network includes a logic stage coupled between a first latch element and a second latch element of the plurality of latch elements of the first counter.

24. The high speed LFSR according to claim 22, further comprising:
   a plurality of multiplexer elements corresponding to each of the plurality of latch elements of the first counter, the multiplexer elements providing a programming function of the LFSR;
   a latch element controlling the multiplexer elements; and
   a reset latch coupled to the output logic element.

25. A method of forming a high speed LFSR, the method comprising:
   forming a first counter capable of producing an odd number of counter states using a first plurality of series coupled latch elements;
   forming a second counter capable of producing an even number of counter states using a second plurality of series coupled latch elements coupled in parallel with the first plurality of latch elements;
   generating a primitive polynomial using a feedback logic network decomposed into multiple logic stages;
   distributing a feedback logic network across multiple latch elements of the first counter such that a latch-to-latch operational latency of the LFSR does not exceed one gate delay;
   storing a first parallel output of a first stage of the feedback logic network in a first pipeline latch coupled in parallel with one of the plurality of latch elements of the first counter; and
   detecting a complete cycle of the counter states using an output logic element coupled to the outputs of each of the plurality of latch elements of the first counter and the second counter.

* * * * *